United States Patent
Lee et al.

(10) Patent No.: US 9,978,458 B2
(45) Date of Patent: May 22, 2018

(54) MEMORY DEVICE, MEMORY SYSTEM, AND READ/VERIFY OPERATION METHOD OF THE MEMORY DEVICE

(71) Applicant: Samsung Electronics Co., Ltd., Suwon-si, Gyeonggi-do (KR)

(72) Inventors: Yo-han Lee, Incheon (KR); Ji-suk Kim, Seoul (KR); Chang-yeon Yu, Hwaseong-si (KR); Jin-young Chun, Seoul (KR); Se-heon Baek, Seoul (KR); Jun-young Ko, Seoul (KR); Seong-ook Jung, Seoul (KR); Ji-su Kim, Incheon (KR)

(73) Assignees: Samsung Electronics Co., Ltd., Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days. days.

(21) Appl. No.: 15/383,132

(22) Filed: Dec. 19, 2016

(65) Prior Publication Data

US 2017/0278579 A1    Sep. 28, 2017

(30) Foreign Application Priority Data

Mar. 25, 2016  (KR) ........................ 10-2016-0036110

(51) Int. Cl.
| | |
|---|---|
| G11C 11/34 | (2006.01) |
| G11C 16/34 | (2006.01) |
| G11C 16/28 | (2006.01) |
| G11C 16/04 | (2006.01) |
| G11C 16/08 | (2006.01) |
| G11C 16/26 | (2006.01) |
| G11C 11/56 | (2006.01) |

(52) U.S. Cl.
CPC ...... *G11C 16/3459* (2013.01); *G11C 16/0483* (2013.01); *G11C 16/08* (2013.01); *G11C 16/26* (2013.01); *G11C 16/28* (2013.01); *G11C 11/5642* (2013.01)

(58) Field of Classification Search
CPC .......................... G11C 16/3459; G11C 16/28
USPC ............ 365/185.17, 185.01, 185.03, 185.05, 365/185.11, 185.12, 185.14, 185.19, 365/185.22, 185.23, 185.24
See application file for complete search history.

(56) References Cited

U.S. PATENT DOCUMENTS

| | | |
|---|---|---|
| 7,760,550 B2 | 7/2010 | Fayrushin et al. |
| 7,813,181 B2 | 10/2010 | Cernea |

(Continued)

FOREIGN PATENT DOCUMENTS

| | | | |
|---|---|---|---|
| JP | 2010-287283 | * | 12/2010 |
| JP | 2010-287283 A | | 12/2010 |

*Primary Examiner* — Fernando Higalgo
(74) *Attorney, Agent, or Firm* — Harness, Dickey & Pierce, P.L.C.

(57) ABSTRACT

A data read operation method of a memory device includes applying a read voltage having a first preparation level and a first target level to a word line of a selected cell in the memory device to read a program state of the selected cell, applying a first read pass voltage having a second preparation level and a second target level to at least one word line of first non-selected cells not adjacent to the selected cell and in the same string as the selected cell, and applying a second read pass voltage having a third target level to a word line of at least one second non-selected cell adjacent to the selected cell.

19 Claims, 20 Drawing Sheets

(56) References Cited

U.S. PATENT DOCUMENTS

| | | |
|---|---|---|
| 8,031,530 B2 | 10/2011 | Joo |
| 8,194,465 B2 | 6/2012 | Namiki et al. |
| 8,374,031 B2 | 2/2013 | Yuh |
| 8,472,266 B2 | 6/2013 | Khandelwal et al. |
| 8,824,206 B2 | 9/2014 | Oishi et al. |
| 8,942,043 B2 | 1/2015 | Yuan et al. |
| 9,064,597 B2 | 6/2015 | Cho et al. |
| 2013/0051152 A1 | 2/2013 | Lee et al. |
| 2015/0009760 A1 | 1/2015 | Nam et al. |

* cited by examiner

MEMORY DEVICE, MEMORY SYSTEM, AND READ/VERIFY OPERATION METHOD OF THE MEMORY DEVICE

CROSS-REFERENCE TO RELATED APPLICATION

This application claims the benefit of Korean Patent Application No. 10-2016-0036110, filed on Mar. 25, 2016, in the Korean Intellectual Property Office, the disclosure of which is incorporated herein in its entirety by reference.

BACKGROUND

Example embodiments of the inventive concepts relate to a memory device, a memory system, and/or a read/verify operation method of the memory device. For example, at least some example embodiments relate to a memory device for reducing a setup time of a word line voltage that is applied to a word line of a selected cell, a memory system including the memory device, and/or a read/verify operation method of the memory device.

Memory devices are used to store data and are classified into volatile memory devices and non-volatile memory devices. A flash memory device is an example of a non-volatile memory device that may be used in a mobile phone, a digital camera, a personal digital assistant (PDA), a portable computer device, a fixed computer device, and the like.

SUMMARY

At least some example embodiments of the inventive concepts provide a memory device for reducing a setup time of a word line voltage, which is applied to a word line of a selected cell, to, for example, improve a read/verify operation speed.

Example embodiments of the inventive concepts provide a memory system including the memory device.

Example embodiments of the inventive concepts also provide a read/verify operation method of the memory device.

According to an example embodiment of the inventive concepts, there is provided a data read operation method of a memory device, the method including: applying a read voltage having a first preparation level and a first target level to a word line of a selected cell in the memory device to read a program state of the selected cell; applying a first read pass voltage having a second preparation level and a second target level to at least one word line of first non-selected cells not adjacent to the selected cell and in the same string as the selected cell; and applying a second read pass voltage having a third target level to a word line of at least one second non-selected cell adjacent to the selected cell.

According to an example embodiment of the inventive concepts, there is provided a program verify operation method of a memory device, the method including: applying a program voltage to a word line of a selected cell of the memory device and applying a program pass voltage to word lines of non-selected cells of the memory device; applying a verify voltage having a first preparation level and a first target level to the word line of the selected cell to verify a program state of the selected cell; applying a first verify pass voltage having a second preparation level and a second target level to at least one word line of first non-selected cells, not adjacent to the selected cell and in the same string as the selected cell, from among the non-selected cells; and applying a second verify pass voltage having a third target level to a word line of at least one second non-selected cell adjacent to the selected cell from among the non-selected cells.

According to an example embodiment of the inventive concepts, a method of controlling a memory device may include receiving a request to read a program state associated a selected cell of the memory device; applying a read voltage to a word line of the selected cell such that the read voltage sequentially has a first preparation level and a target level; and applying at least two read pass voltages to different ones of non-selected cells of the memory devices based on whether the non-selected cells are adjacent to the selected cell.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
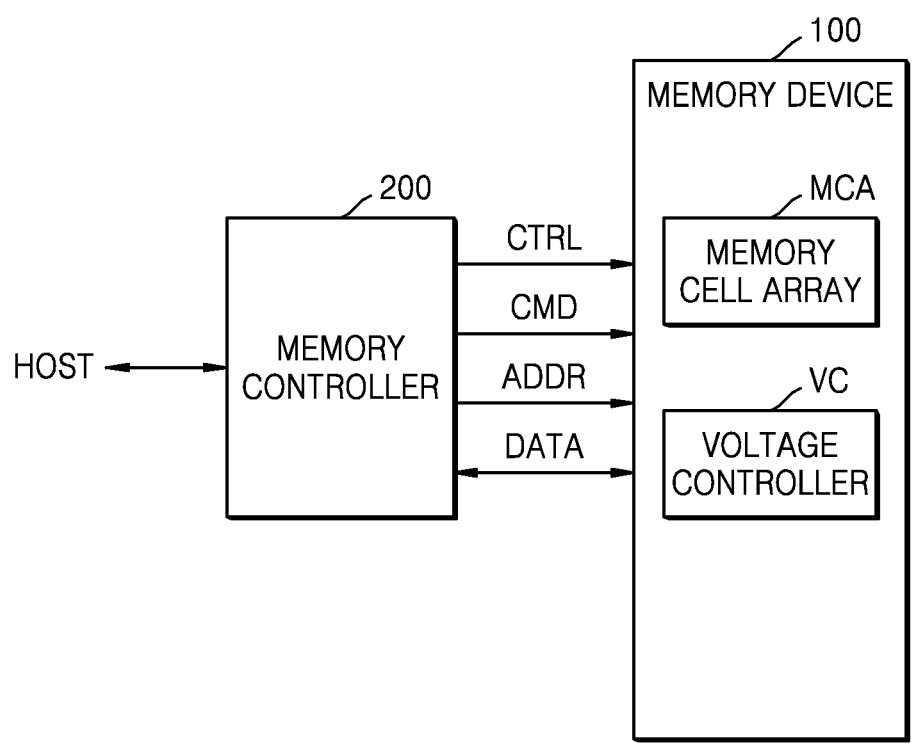
FIG. 1 is a schematic block diagram of a memory system according to an example embodiment.

FIG. 1 is a schematic block diagram of a memory system 10 according to an example embodiment.

Referring to FIG. 1, the memory system 10 may include a memory device 100 and a memory controller 200. The memory device 100 may include a memory cell array MCA and a voltage controller VC.

The memory cell array MCA may include a plurality of memory cells. For example, the plurality of memory cells may be flash memory cells. Hereinafter, an example in which the plurality of memory cells are NAND flash memory cells is described. However, example embodiments of the inventive concepts are not limited thereto. For example, in other example embodiments, the plurality of memory cells may be resistive memory cells such as resistive random access memory (RRAM), phase-change random access memory (PRAM), or magnetic random access memory (MRAM).

In an example embodiment, the memory cell array MCA may be a three-dimensional (3D) memory array. The 3D memory array is a monolithic memory array where memory cell arrays, which have active areas arranged on a silicon substrate and circuits related to operations of memory cells and formed on or in the silicon substrate, are formed in at least one physical level. The term "monolithic" indicates that layers of each level of the array are directly stacked on layers of each lower level of the array.

In an example embodiment, the 3D memory array includes NAND strings vertically arranged in such a manner that at least one memory cell is above another memory cell. The at least one memory cell may include a charge trap layer. U.S. Pat. No. 7,679,133, U.S. Pat. No. 8,553,466, U.S. Pat. No. 8,654,587, U.S. Pat. No. 8,559,235, and US Patent Application Publication No. 2011-0233648, which disclose structures in which a 3D memory array is formed in a plurality of levels and word lines and/or bit lines are shared between the levels, are herein incorporated by reference. In addition, US Patent Application Publication No. 2014-0334232 and U.S. Pat. No. 8,488,381 are herein incorporated by reference.

The memory controller 200 may control the memory device 100 to read data stored in the memory device 100 and/or write data to the memory device 100 in response to a read/write request transmitted from a host HOST. In detail, the memory controller 200 may control a program (or write) operation, a read operation, and/or an erase operation for the memory device 100 by providing the memory device 100 with an address ADDR, a command CMD, and/or a control signal CTRL. In addition, data DATA for a program operation and read data DATA may be transmitted and received between the memory controller 200 and the memory device 100.

Although not shown, the memory controller 200 may include memory, a processor, a host interface, and a memory interface.

The memory may be used as an operation memory of the processing unit. The memory may include may include a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The processor may control operations of the memory controller 200. The processor may be an arithmetic logic unit, a digital signal processor, a microcomputer, a field programmable array, a programmable logic unit, a microprocessor or any other device capable of responding to and executing instructions in a defined manner. The memory may contain computer readable code that, when executed by the processor, configures the processor as a special purpose computer.

The host interface may include protocols for exchanging data between the host HOST and the memory controller 200. For example, the memory controller 200 may be configured to communicate with the outside, that is, the host HOST, via at least one of various interface protocols such as Universal Serial Bus (USB), Multimedia Card (MMC), peripheral Component Interconnect Express (PCI-E), Advanced Technology Attachment (ATA), Serial-ATA, Parallel-ATA, Small Computer System Interface (SCSI), Enhanced Small Device Interface (ESDI), and Integrated Drive Electronics (IDE).

The memory device 100 may perform a program operation, a verify operation, and/or a read operation, in response to the address ADDR, the command CMD, and the control signal CTRL received from the memory controller 200.

The voltage controller VC may control applying a word line voltage used for a program operation, a verify operation, or a read operation to each word line of the memory cell array MCA.

In an example embodiment, when the memory device 100 performs a read operation, the voltage controller VC may control a read voltage, which is applied to a word line of a selected cell corresponding to a read target, and a read pass voltage, which is applied to word lines of non-selected cells. For example, the voltage controller VC may control a first read pass voltage, which is applied to word lines of first non-selected cells not adjacent to a selected cell and in the same string as the selected cell, to be different from a second read pass voltage, which is applied to word lines of second non-selected cells adjacent to the selected cell.

A second non-selected cell adjacent to a selected cell may be an upper cell or lower cell directly adjacent to the selected cell. However, example embodiments of the inventive concepts are not limited thereto, and second non-selected cells adjacent to the selected cell may be a plurality of upper cells located adjacently above the selected cell or a plurality of lower cells located adjacently below the selected cell.

In detail, the voltage controller VC may control a read voltage, which is applied to the word line of the selected cell, to vary from a start level to a first preparation level and vary from the first preparation level to a first target level. Also, the voltage controller VC may control a first read pass voltage, which is applied to at least one of the word lines of the first non-selected cells, to vary from a start level to a second preparation level and vary from the second preparation level to a second target level. The voltage controller VC may control a second read pass voltage, which is applied to at least one of the word lines of the second non-selected cells, to vary from a start level to a third target level.

In other words, the voltage controller VC may control the read voltage, which is applied to the word line of the selected cell, and the first read pass voltage, which is applied to at least one of the word lines of the first non-selected cells, not to directly vary from respective start levels to respective target levels but to change to the respective target levels after varying from respective start levels to respective preparation levels. In addition, the voltage controller VC may control the second read pass voltage, which is applied to at least one of the word lines of the second non-selected cells, to change directly from a start level to a target level. This operation will be described in detail below.

When the memory device 100 performs a verify operation after performing a program operation, the voltage controller VC may control a verify voltage that is applied to each word line of the memory cell array MCA. In an example embodiment, when the memory device 100 performs a verify operation, the voltage controller VC may control a verify voltage, which is applied to a word line of a selected cell corresponding to a verify target, and a verify pass voltage, which is applied to word lines of non-selected cells. For example, the voltage controller VC may control a first verify pass voltage, which is applied to at least one word line of first non-selected cells not adjacent to a selected cell and in the same string as the selected cell, to be different from a second verify pass voltage, which is applied to at least one word line of second non-selected cells adjacent to the selected cell.

In detail, the voltage controller VC may control a verify voltage, which is applied to the word line of the selected cell, to change from a start level to a first preparation level and change from the first preparation level to a first target level. Also, the voltage controller VC may control a first verify pass voltage, which is applied to at least one of the word lines of the first non-selected cells, to change from a start level to a second preparation level and change from the second preparation level to a second target level. The voltage controller VC may control a second verify pass voltage, which is applied to at least one of the word lines of the second non-selected cells, to change from a start level to a third target level.

By using a read/verify operation method of the memory device 100 or the memory system 10 according to example embodiments, a voltage, which is applied to a word line of a selected cell corresponding to a read or verify target, and a voltage, which is applied to a word line of a non-selected cell not adjacent to the selected cell, and a voltage, which is applied to a word line of a non-selected cell adjacent to the selected cell, may be controlled, thereby reducing a setup time that is required for setting up the voltage, which is applied to the word line of the selected cell, from a start level to a target level. By reducing the setup time, a read/verify operation of the memory device 100 or the memory system 10 may be rapidly performed, thereby improving the performance of the memory device 100 or the memory system 10.

Figure 2:
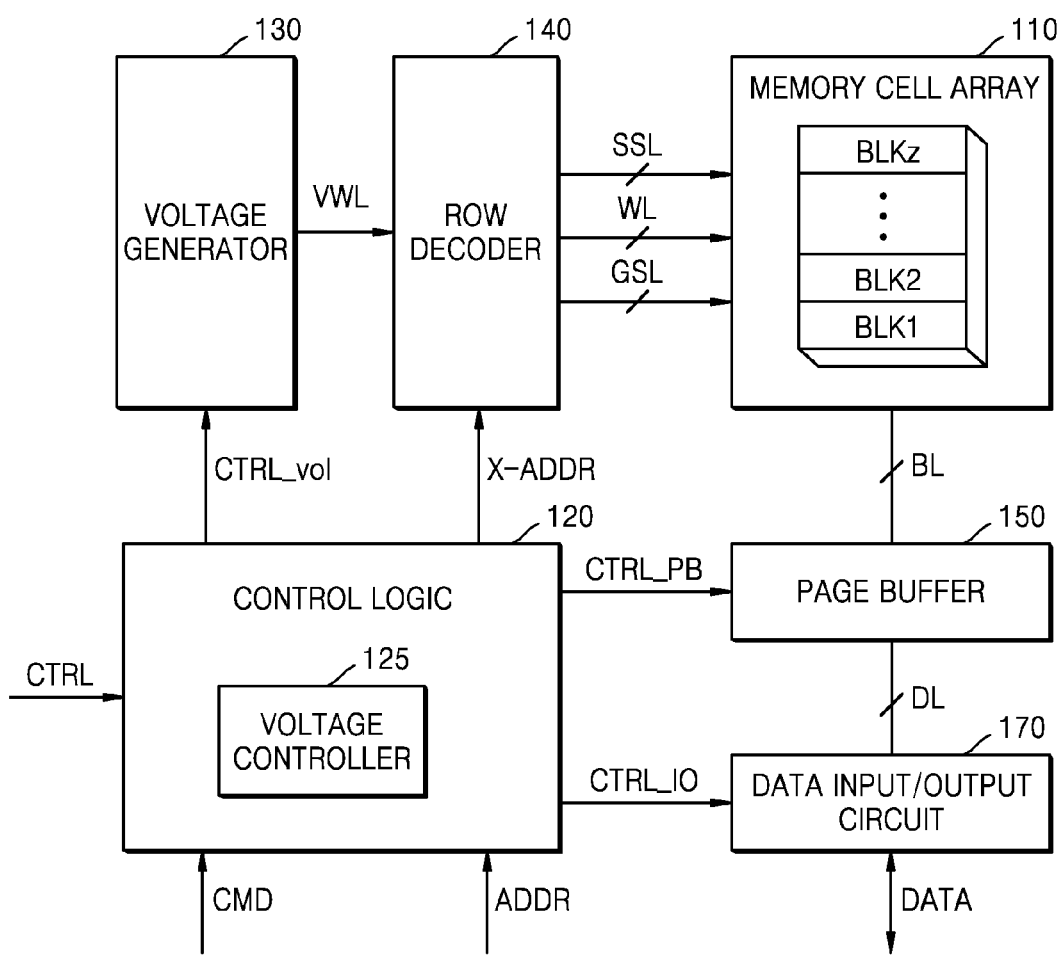
FIG. 2 is a block diagram of a memory device illustrated in FIG. 1.

FIG. 2 is a block diagram of the memory device 100 illustrated in FIG. 1.

Referring to FIG. 2, the memory device 100 may include the memory cell array 110, a control logic 120, a voltage generator 130, a row decoder 140, a page buffer 150, and a data input/output circuit 170. Although not shown, the memory device 1000 may further include an input/output interface.

The memory cell array 110 includes a plurality of memory cells and may be connected to word lines WL, string selection lines SSL, ground selection lines GSL, and bit lines BL. In detail, the memory cell array 110 may be connected to the row decoder 140 via the word lines WL, the string selection lines SSL, and the ground selection lines GSL, and to the page buffer 150 via the bit lines BL.

The memory cell array 110 may include a plurality of blocks BLK1 to BLKz, and each of the plurality of blocks BLK1 to BLKz may have a 3D structure (or a vertical structure). In detail, each of the plurality of blocks BLK1 to BLKz may include a structure extending in first to third directions. For example, each of the plurality of blocks BLK1 to BLKz may include a plurality of NAND strings (hereinafter, referred to as "strings") extending in the third direction. The plurality of strings may be spaced apart from each other by a certain distance in the first and second directions. The plurality of blocks BLK1 to BLKz may be selected by the row decoder 140. For example, the row decoder 140 may select any one of the plurality of blocks BLK1 to BLKz in response to a block address.

The memory cell array 110 may include at least one selected from a single-level cell block including single-level cells, a multi-level cell block including multi-level cells, and a triple-level cell block including triple-level cells. In other words, some of the blocks BLK1 to BLKz included in the memory cell array 110 may be single-level cell blocks, and others thereof may be multi-level cell blocks or triple-level cell blocks.

The control logic 120 may output various control signals for writing data to the memory cell array 110 or reading data from the memory cell array 110, based on a command CMD, an address ADDR, and/or a control signal CTRL received from the memory controller 200. Thus, the control logic 120 may control various operations in the memory device 100.

The control signals output from the control logic 120 may be provided to the voltage generator 130, the row decoder 140, and/or the page buffer 150. In detail, the control logic 120 may provide a voltage control signal CTRL_vol to the voltage generator 130, a row address X-ADDR to the row decoder 140, and a column address to the page buffer 150. However, example embodiments of the inventive concepts are not limited thereto, and the control logic 120 may further provide other control signals to the voltage generator 130, the row decoder 140, and the page buffer 150.

In some example embodiments, the control logic 120 may include a word line voltage controller 125 (hereinafter, referred to as a voltage controller 125). The voltage controller 125 may generate the voltage control signal CTRL_vol that is used to generate a word line voltage for driving the word lines WL, a string selection line voltage for driving the string selection lines SSL, and a ground selection line voltage for driving the ground selection lines GSL.

The voltage controller 125 may include a memory and a processor.

The memory may include may include a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The processor may control operations of the voltage controller 125. The processor may be an arithmetic logic unit, a digital signal processor, a microcomputer, a field programmable array, a programmable logic unit, a microprocessor or any other device capable of responding to and executing instructions in a defined manner. The memory may contain computer readable code that, when executed by the processor, configures the processor as a special purpose computer to generate and apply a read voltage to a word line of the selected cell such that the read voltage is sequentially set to a first preparation level and a target level; and generate and apply at least two read pass voltages to different ones of non-selected cells of the memory devices based on whether the non-selected cells are adjacent to the selected cell. Therefore, the processor may improve the functioning of the memory device 100 itself by reducing a setup time for the read voltage to reach to a target level.

In an example embodiment, when a read or verify operation is performed on data programmed in the memory cell array 110, the voltage controller 125 may generate the voltage control signal CTRL_vol so that a read voltage or verify voltage, which is applied to a word line of a selected cell, has a first preparation level and a first target level, a first read pass voltage or first verify pass voltage, which is applied to at least one word line of first non-selected cells not adjacent to the selected cell, has a second preparation level and a second target level, and a second read pass voltage or second verify pass voltage, which is applied to at least one word line of second non-selected cells adjacent to the selected cell, has a third target level.

In an example embodiment, the first read pass voltage or first verify pass voltage and the second read pass voltage or second verify pass voltage may be voltages that make non-selected cells be turned on regardless of data of the non-selected cells (first non-selected cells and second non-selected cells). To this end, the first read pass voltage or first verify pass voltage and the second read pass voltage or second verify pass voltage may be set to have a level that is greater than the highest threshold voltage level of threshold voltages of programmed cells.

In an example embodiment, the voltage controller 125 may control a first target level of a read voltage or verify voltage, which is applied to a word line of a selected cell, to be greater than a first preparation level, and may also control the first preparation level to have a negative level according to the size of the first target level. Also, the voltage controller 125 may control a second target level of a first read pass voltage or first verify pass voltage, which is applied to at least one word line of first non-selected cells, to be greater than a second preparation level. Also, the voltage controller 125 may control the second target level of the first read pass voltage or first verify pass voltage to be equal to or different from a third target level of a second read pass voltage or second verify pass voltage.

In an example embodiment, the voltage controller 125 may control at least one selected from a first preparation level of a read voltage or verify voltage and a second preparation level of a first read pass voltage to vary depending on the size of a first target level of the read voltage or verify voltage that is applied to a word line of a selected cell. In detail, the voltage controller 125 may determine the size of the first target level of the read voltage or verify voltage that is applied to the word line of the selected cell in a read operation or a verify operation. The voltage controller 125 may vary the size of at least one of the first preparation level and the second preparation level, based on the determined size of the first target level. This operation will be described in detail below.

In an example embodiment, the voltage controller 125 may control a voltage, which is applied to word lines of first non-selected cells, and a voltage, which is applied to word lines of second non-selected cells, based on the location of a word line of a selected cell in the memory cell array 110.

For example, the voltage controller 125 may control a first read pass voltage or first verify pass voltage selectively having a second preparation level and a second target level to be applied to upper word lines based on the location of a word line of a selected cell, and may control a third read pass voltage or third verify pass voltage selectively having the second target level to be applied to lower word lines based on the location of the word line of the selected cell. However, example embodiments of the inventive concepts are not limited thereto. The voltage controller 125 may control a third read pass voltage or third verify pass voltage selectively having a second target level to be applied to the upper word lines, and may control a first read pass voltage or first verify pass voltage selectively having the second preparation level and the second target level to be applied to the lower word lines.

The third read pass voltage or third verify pass voltage may be voltages that are directly set to the second target level without having a step in which the third read pass voltage or third verify pass voltage is set to a desired (or, alternatively, a predetermined) preparation level.

In an example embodiment, the voltage controller 125 may control some word lines of non-selected cells not adjacent to a selected cell in the memory cell array 110 to be selected based on the location of the word line of the selected cell, may control the first read pass voltage or first verify voltage to be applied to the selected word lines, and may control the third read pass voltage or third verify pass voltage to be applied to non-selected other word lines. This operation will be described in detail below.

The row decoder 140 may select some of the word lines WL in response to the row address X-ADDR received from the control logic 120. In detail, during a read operation, the row decoder 140 may apply a read voltage to a selected word line and apply a read inhibit voltage to non-selected word lines. During a program operation, the row decoder 140 may apply a program voltage to a selected word line and apply a program inhibit voltage to non-selected word lines. Also, the row decoder 140 may select some of the string selection lines SSL or some of the ground selection lines GSL in response to the row address X-ADDR received from the control logic 120.

The page buffer 150 may be connected to the memory cell array 110 via the bit lines BL, and may select some of the bit lines BL in response to the column address received from the control logic 120. In detail, during a read operation, the page buffer 150 may operate as a sense amplifier and sense data DATA stored in the memory cell array 110. During a program operation, the page buffer 150 may operate as a write driver and input data DATA to be stored to the memory cell array 110.

Figure 3A:
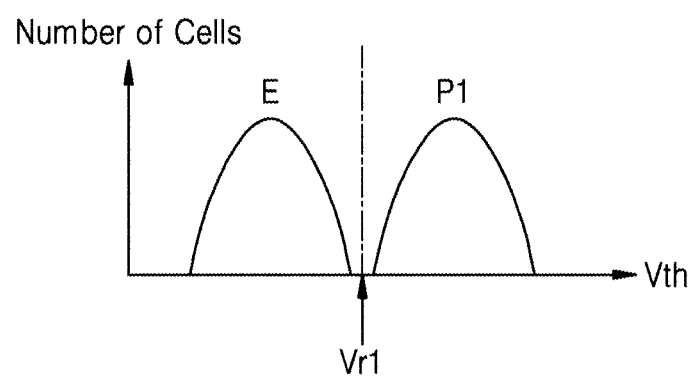
FIGS. 3A to 3C are graphs illustrating distribution according to a threshold voltage of memory cells of a memory device according to an example embodiment.
Figure 3B:
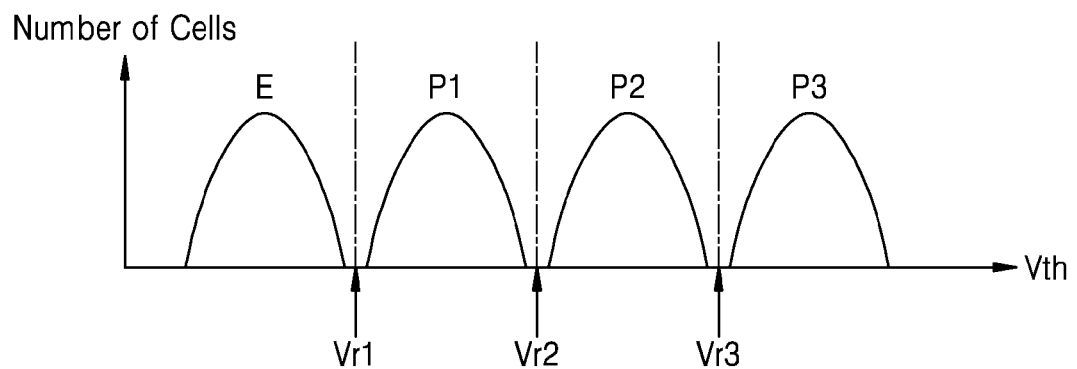
Figure 3C:
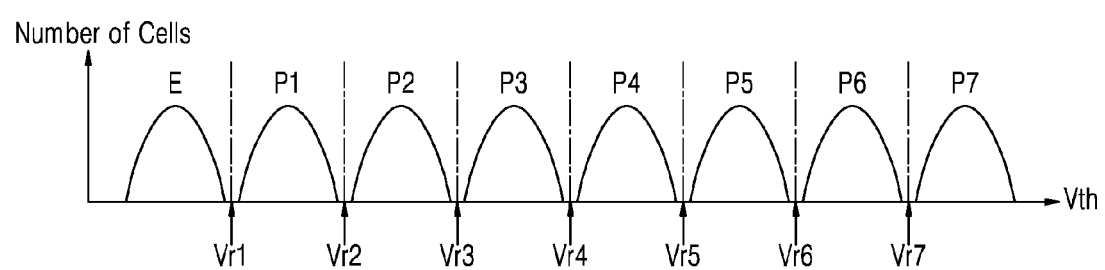

FIGS. 3A to 3C are graphs illustrating distribution according to a threshold voltage of memory cells of a memory device according to an example embodiment.

Referring to FIGS. 3A to 3C, the horizontal axis of each graph indicates a threshold voltage Vth and the vertical axis of each graph indicates the number of memory cells. Memory cells of the memory device according to example embodiments may be single-bit level cells programmed to store 1-bit data, as shown in FIG. 3A, may be multi-bit level cells programmed to store 2-bit data, as shown in FIG. 3B, and may be multi-bit level cells programmed to store 3-bit data, as shown in FIG. 3C. However, the memory cells of the memory device according to example embodiments are not limited thereto and may be programmed to store 4 or more bit data.

The memory cells of the memory device may have different program states according to the number of bits that are stored in each of the memory cells. As shown in FIG. 3A, when the memory cells of the memory device are single-bit level cells programmed to store 1-bit data, the memory cells may have a threshold voltage distribution of a memory cell having an erase state E and a threshold voltage distribution of a memory cell having a first program state P1. As shown in FIG. 3B, when the memory cells of the memory device are multi-bit level cells programmed to store 2-bit data, the memory cells may have a threshold voltage distribution of a memory cell having an erase state E and a threshold voltage distribution of a memory cell having a first program state P1 to a third program state P3. As shown in FIG. 3C, when the memory cells of the memory device are multi-bit level cells programmed to store 3-bit data, the memory cells may have a threshold voltage distribution of a memory cell having an erase state E and a threshold voltage distribution of a memory cell having a first program state P1 to a seventh program state P7.

Figure 4:
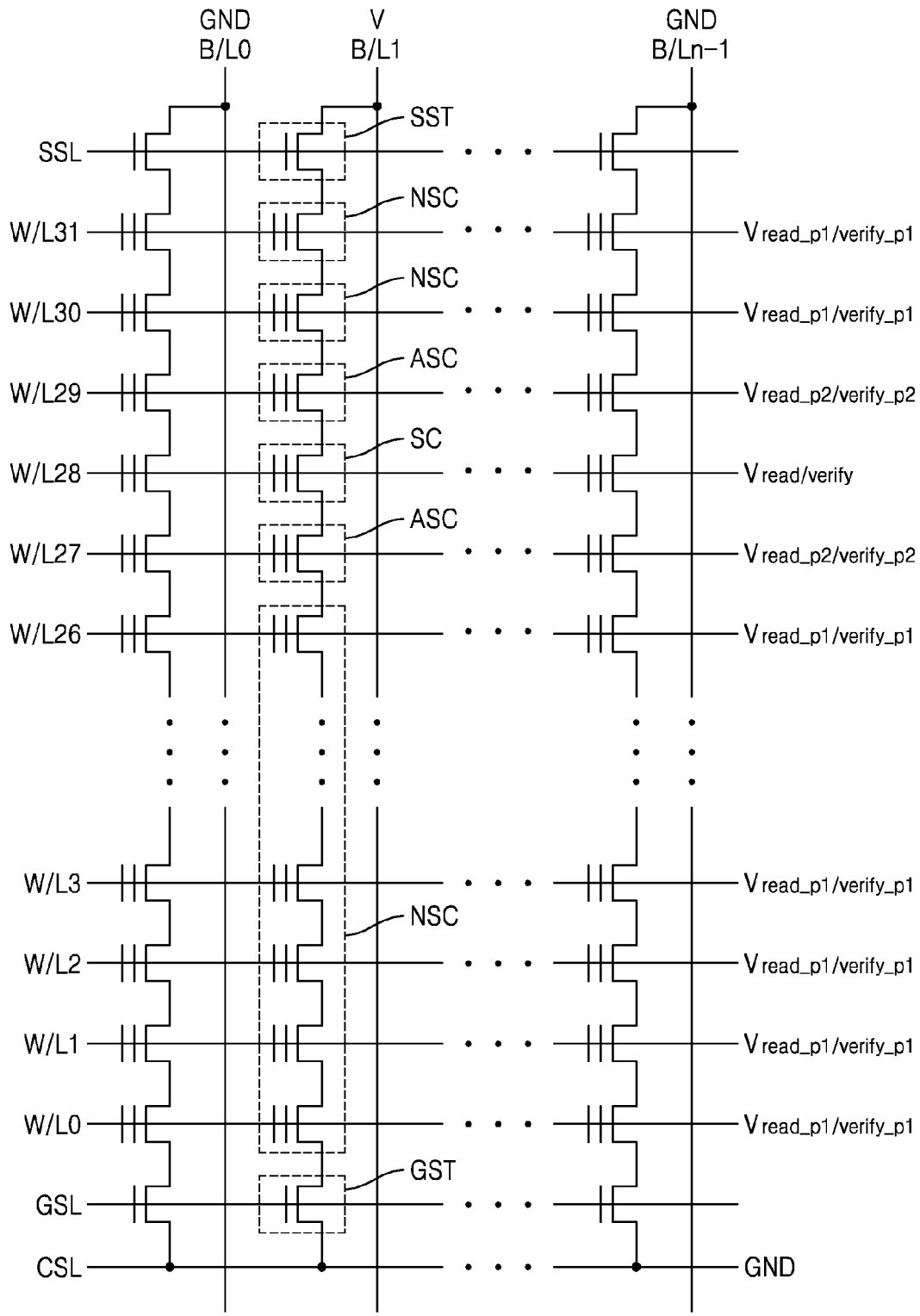
FIG. 4 is a circuit diagram of an equivalent circuit of a first block of FIG. 2, which is for describing a voltage that is applied to each word line, according to an example embodiment.
Figure 5:
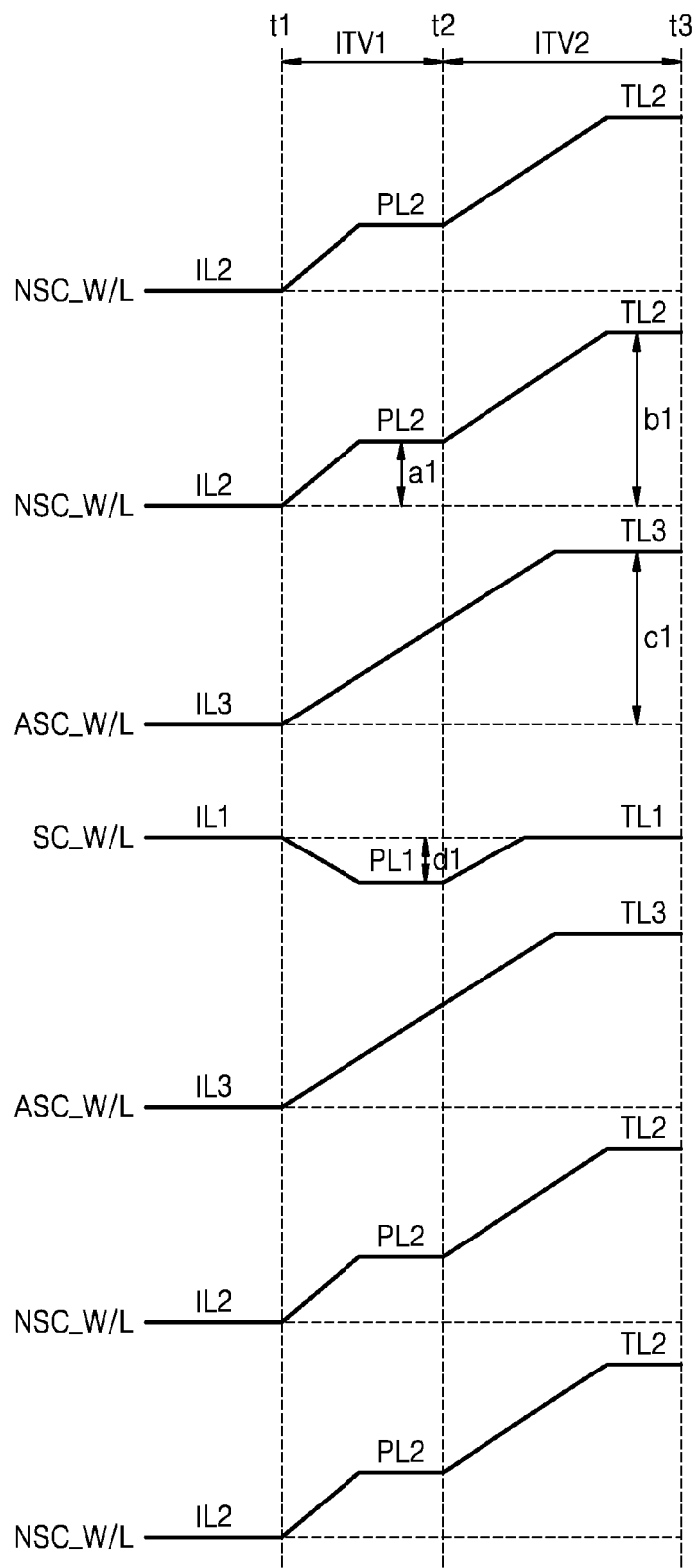
FIG. 5 is a timing diagram for describing a method of controlling a voltage level of each word line, according to an example embodiment.

FIG. 4 is a circuit diagram of an equivalent circuit of the first block BLK1 of FIG. 2, which is for describing a voltage that is applied to each word line, according to an example embodiment. FIG. 5 is a timing diagram for describing a method of controlling a voltage level of each word line, according to an example embodiment.

Referring to FIG. 4, the first block BLK1 in the memory cell array 110 of the memory device 100 illustrated in FIG. 2 may include string selection transistors SST connected to a plurality of bit lines B/L0 to B/Ln−1, respectively, ground selection transistors GST connected to a common source line CSL, and a plurality of memory cells connected in series between each string selection transistor SST and each ground selection transistor GST. Each of the plurality of memory cells is connected to a corresponding one of the plurality of word lines W/L0 to W/L31.

Hereinafter, a method of controlling a voltage, which is applied to a word line of a selected cell, and a voltage, which is applied to word lines of non-selected cells, in a read operation of the memory device 100 is described. For example, a selected cell SC may correspond to a cell where the bit line B/L and the word line W/L28 cross each other, as shown in FIG. 4. However, example embodiments of the inventive concepts are not limited thereto, and any other cell may be selected.

A bit line voltage V for a read operation may be applied to the bit line B/L of the selected cell SC. A read voltage Vread may be applied to the word line W/L28 of the selected cell SC. When the memory cells are multi-bit level cells, data having two or more bits is read from one cell, according to a threshold voltage thereof, and thus, the read voltage Vread may have various levels to sense data of the selected cell SC, according to a program state of the selected cell SC. A first read pass voltage Vread_p1 may be applied to the word lines W/L0 to W/L26, W/L30, and W/L31 connected to first non-selected cells NSC, not at both sides directly adjacent to the selected cell SC and in the same string (i.e., a selected string) as the selected cell SC. A second read pass voltage Vread_p2 may be applied to the word lines W/L27 and W/L29 connected to adjacent cells (hereinafter, referred to as second non-selected cells ASC) at both sides of the selected cell SC. However, this is only an example embodiment, and only one of the second non-selected cells ASC may be selected and the second read pass voltage Vread_p2 may be applied only to a word line of the selected second non-selected cell ASC. In this case, the first read pass voltage Vread_p1 may be applied to a word line of a second non-selected cell.

Referring to FIG. 5, the voltage controller 125 of FIG. 2 may control word line voltages that are applied to the memory cell array 110, according to the timing diagram shown in FIG. 5. The voltage controller 125 may control a read voltage, which is applied to a word line (hereinafter, referred to as a selected word line SC_W/L) connected to a selected cell, to have a first preparation level PL1 and a first target level TL1. In an example embodiment, a read voltage that is applied to the selected word line SC_W/L by the voltage controller 125 may be set up from a start level IL1 to the first preparation level PL1 during a first period ITV1, and the read voltage may be set up from the first preparation level PL1 to the first target level TL1 during a second period ITV2. The voltage controller 125 of FIG. 2 may variously control the size of the first target level TL1 of the read voltage according to a program state of the selected cell corresponding to a read target, as shown in FIG. 3B. Also, the voltage controller 125 may differently control the size of the first preparation level PL1 according to a program state of the selected cell corresponding to the read target. In other words, the voltage controller 125 may control the size of the first preparation level PL1, based on the size of the first target level TL1 which is necessary for a read operation.

For example, the first target level TL1 may be substantially the same as a level of a first voltage Vr1 for determining whether a memory cell is in an erase state E and a first program state P1. For example, the first target level TL1 may be 0 volts (V) and the first preparation level PL1 may be a negative voltage level d1. The first period ITV1 may be a period during which a read voltage is changed from the start level IL1 to the first preparation level PL1, and the second period ITV2 may be a period during which a read voltage is changed from the first preparation level PL1 to the first target level TL1.

A first read pass voltage that is applied to a word line (hereinafter, a first non-selected word line NSC_W/L) connected to first non-selected cells may be controlled to have a second preparation level PL2 and a second target level TL2. In an example embodiment, the first read pass voltage that is applied to the first non-selected word line NSC_W/L by the voltage controller 125 may be changed from a start level IL2 to a second preparation level PL2 during the first period ITV1, and then may be changed from the second preparation level PL2 to a second target level TL2 during the second period ITV2. In FIG. 5, although the first read pass voltage has only the second preparation level PL2 during the first period ITV1, example embodiments of the inventive concepts are not limited thereto and the first read pass voltage may have two or more preparation levels during the first period ITV1.

The voltage controller 125 of FIG. 2 may variously control the size b1 of the second target level TL2 of the first read pass voltage according to a program state of the selected cell corresponding to a read target, as shown in FIG. 3B. Also, the voltage controller 125 may differently control the size a1 of the second preparation level PL2 according to a program state of the selected cell corresponding to the read target. In other words, the voltage controller 125 may control at least one selected from the size a1 of the second preparation level PL2 of the first read pass voltage and the size b1 of the second target level TL2 of the first read pass voltage, based on the size of the first target level TL1 which is used for a read operation.

In addition, the voltage controller 125 may control the read voltage, which is applied to the selected word line SC_W/L, and the first read pass voltage, which is applied to the first non-selected word line NSC_W/L, so that a time when the read voltage starts to be set up from the first preparation level PL1 to the first target level TL1 is substantially the same as a time when the first read pass voltage starts to be set up from the second preparation level PL2 to the second target level TL2.

The voltage controller 125 may control a second read pass voltage, which is applied to a word line (hereinafter, a second non-selected word line ASC_W/L) connected to a second non-selected cell, to have a third target level TL3. In an example embodiment, the second read pass voltage that is applied to the second non-selected word line ASC_W/L by the voltage controller 125 may be changed from a start level IL3 to a third target level TL3 during the first period ITV1 and the second period ITV2. The size c1 of the third target level TL3 of the second read pass voltage may be controlled to be equal to or similar to the size b1 of the second target level TL2 of the first read pass voltage. However, the size c1 of the third target level TL3 and the size b1 of the second target level TL2 may be controlled to be different from each other. Each of the start levels IL1, IL2, and IL3 corresponds to an initial voltage level when each of the read voltage, the first read pass voltage, and the second read pass voltage starts to be set up to a desired (or, alternatively, a predetermined) target voltage, and the sizes of the start levels IL1, IL2, and IL3 may be controlled to be equal to or different from one another. A specific non-limiting example embodiment will be described below.

Figure 6A:
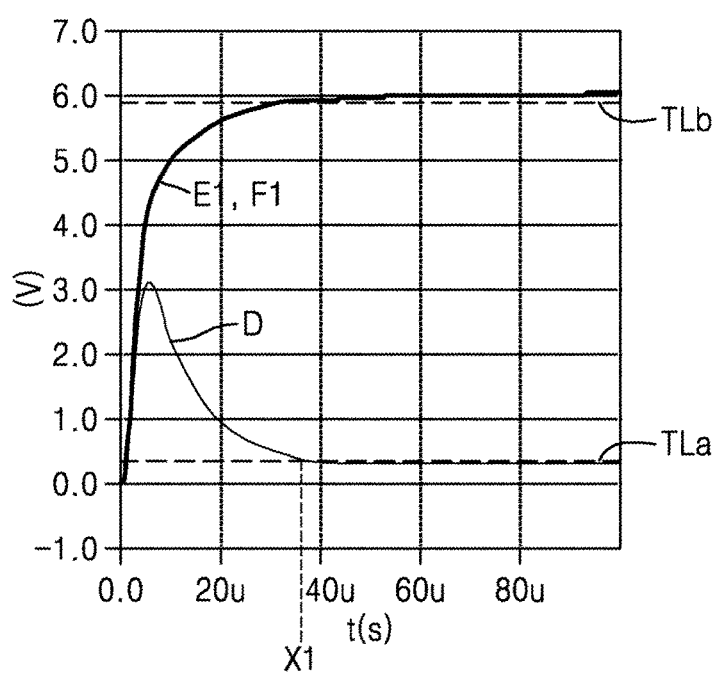
FIGS. 6A and 6B are graphs for describing an effect of a setup time reduction of a read voltage that is applied to a selected word line, according to an example embodiment.
Figure 6B:
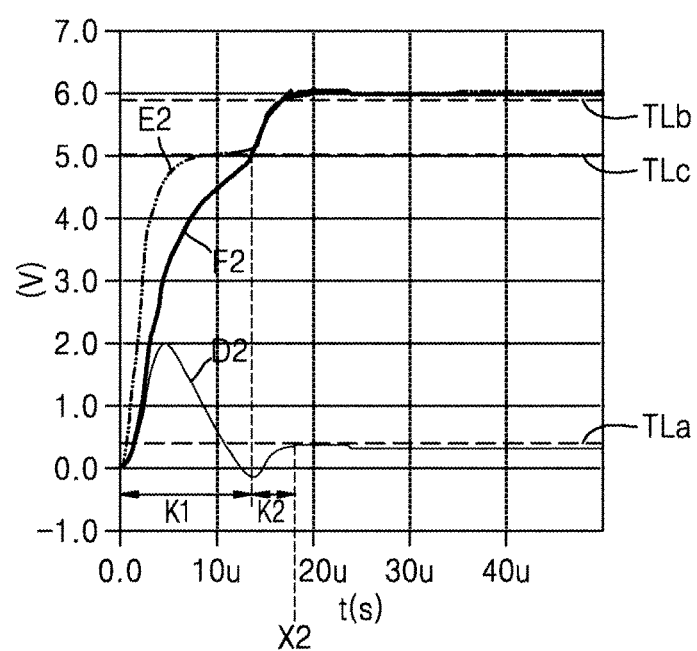

FIGS. 6A and 6B are graphs for describing an effect of a setup time reduction of a read voltage that is applied to a selected word line, according to an example embodiment.

FIG. 6A is a diagram illustrating a read voltage setup time X1 related to a read voltage D1 that is applied to the selected word line SC_W/L when a first read pass voltage E1, which is provided to the first non-selected word line NSC_W/L of FIG. 5, is controlled to have only a desired (or, alternatively, a predetermined) target level TLb without having a preparation level. For example, the first read pass voltage E1 and a second read pass voltage F1 may be directly changed from a start level to the target level TLB. Accordingly, due to a coupling phenomenon occurring while the first read pass voltage E1 and the second read pass voltage F1 are set to the target level TLb, the read voltage D1 may sharply increase together with the first and second read pass voltages E1 and F1 that are temporarily applied to the non-selected word lines NSC_W/L and ASC_W/L. Accordingly, the read voltage setup time X1 corresponding to a time that is taken in order for the read voltage D1 to change to a desired (or, alternatively, a predetermined) target level TLa may increase.

FIG. 6B is a diagram illustrating a read voltage setup time X2 related to a read voltage D2 that is applied to the selected word line SC_W/L when a first read pass voltage E2, which is provided to the first non-selected word line NSC_W/L of FIG. 5, is controlled to have a desired (or, alternatively, a predetermined) preparation level TLc and the desired (or, alternatively, the predetermined) target level TLb. For example, the first read pass voltage E2 may be changed from a start level to the preparation level TLc and changed from the preparation level TLc to the target level TLb. The second read pass voltage F2 may be directly set up from a start level to the target level TLb. Since the first read pass voltage E2 has a preparation level TLc, unlike in FIG. 6A, a coupling phenomenon, which is caused by the first and second read pass voltages E2 and F2 applied to the non-selected word lines NSC_W/L and ASC_W/L having an influence on the read voltage D2, may be reduced. Accordingly, in a period K1, the extent of the rise of the read voltage D2, which is caused by the first and second read pass voltages E2 and F2 applied to the non-selected word lines NSC_W/L and ASC_W/L, may be gentler than that of the read voltage D1 of FIG. 6A.

Furthermore, in another period K2, the first read pass voltage E2 and the second read pass voltage F2 are simultaneously set up to the target level TLb, and thus, the read voltage D2 may quickly rise due to the first read pass voltage E2 and the second read pass voltage F2 and reach the target level TLa. Accordingly, the read voltage setup time X2 corresponding to a time that is taken in order for the read voltage D2 to be set up to the target level TLa may decrease, compared to the read voltage setup time X1 shown in FIG. 6A.

Figure 7:
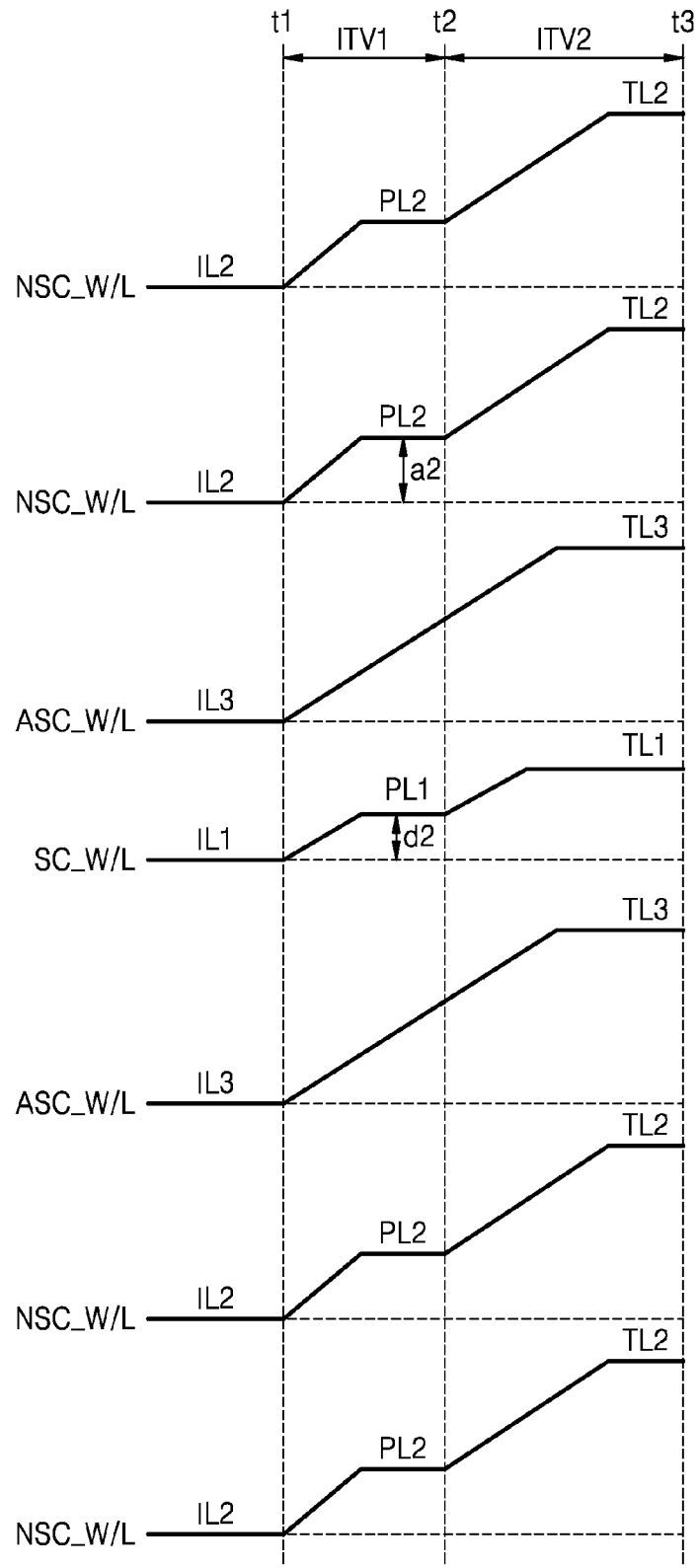
FIG. 7 is a timing diagram for describing a method of controlling a voltage level of each word line, according to another example embodiment.

FIG. 7 is a timing diagram for describing a method of controlling a voltage level of each word line, according to another example embodiment.

Referring to FIG. 7, the voltage controller 125 of FIG. 2 may control a word line voltage that is applied to the memory cell array 110, according to the timing diagram shown in FIG. 7. The voltage controller 125 may control a read voltage, which is applied to a word line (hereinafter, referred to as a selected word line SC_W/L) connected to a selected cell, to have a first preparation level PL1 and a first target level TL1. Also, the voltage controller 125 may variously control the size of the first preparation level PL1 according to a program state of the selected cell corresponding to a read target. In other words, the voltage controller 125 may control the size of the first preparation level PL1, based on the size of the first target level TL1 which is necessary for a read operation.

In an example embodiment, the first target level TL1 may be substantially the same as a level of a second voltage Vr2 for determining whether a memory cell is in a first program state P1 and a second program state P2, as shown in FIG. 3B. In other words, the voltage controller 125 may control the first target level TL1 of FIG. 7 to be greater than the first target level TL1 of FIG. 5. Furthermore, the voltage controller 125 may control the first preparation level PL1 to be a positive voltage level d2, based on the first target level TL1.

In an example embodiment, the voltage controller 125 may variously control the size a2 of a second preparation level PL2 according to a program state of the selected cell corresponding to the read target. In other words, the voltage controller 125 may control the size a2 of the second preparation level PL2 of a first read pass voltage, based on the size of the first target level TL1 which is necessary for a read operation. For example, the voltage controller 125 may control the second preparation level PL2 so that the size of the second preparation level PL2 increases as the size of the first target level TL1 increases. Since the first target level TL1 of the read voltage of FIG. 7 is greater than the first target level TL1 of the read voltage of FIG. 5, the voltage controller 125 may control the size a2 of the second preparation level PL2 of the first read pass voltage of FIG. 7 to be greater than the size a1 of the second preparation level PL2 of the first read pass voltage of FIG. 5.

Figure 8:
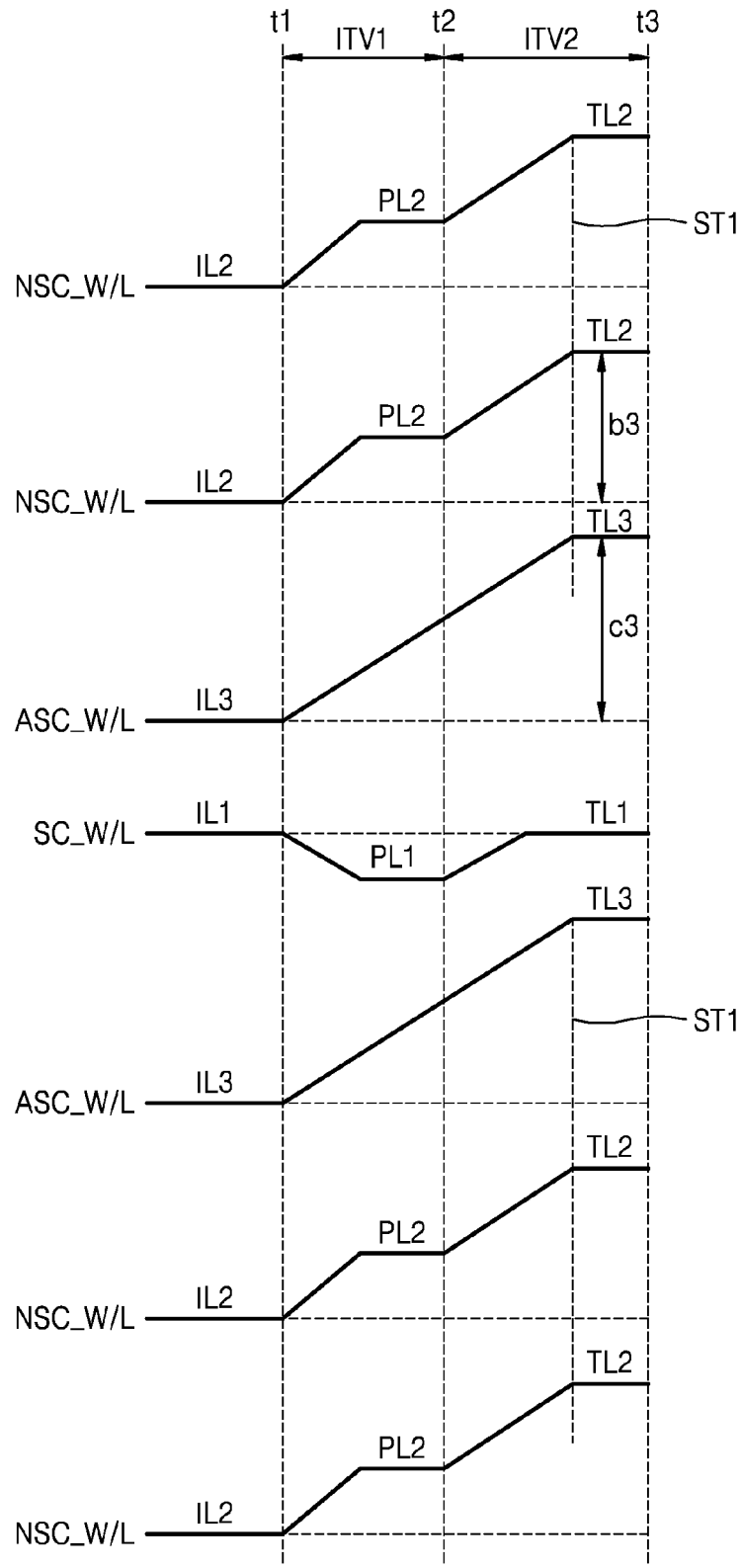
FIG. 8 is a timing diagram for describing a method of controlling a voltage level of each word line, according to another example embodiment.

FIG. 8 is a timing diagram for describing a method of controlling a voltage level of each word line, according to another example embodiment.

Referring to FIG. 8, the voltage controller 125 of FIG. 2 may control a word line voltage that is applied to the memory cell array 110, according to the timing diagram shown in FIG. 8. The voltage controller 125 may control the size b3 of a second target level TL2 of a first read pass voltage to be less than the size c3 of a third target level TL3 of a second read pass voltage. As a result, a time ST1 when the first read pass voltage is completely changed from a second preparation level PL2 to the second target level TL2 may be substantially the same as a time ST1 when the second read pass voltage is completely set up from a start level to the third target level TL3. Details have been described above with reference to FIG. 5 and thus are omitted.

Figure 9:
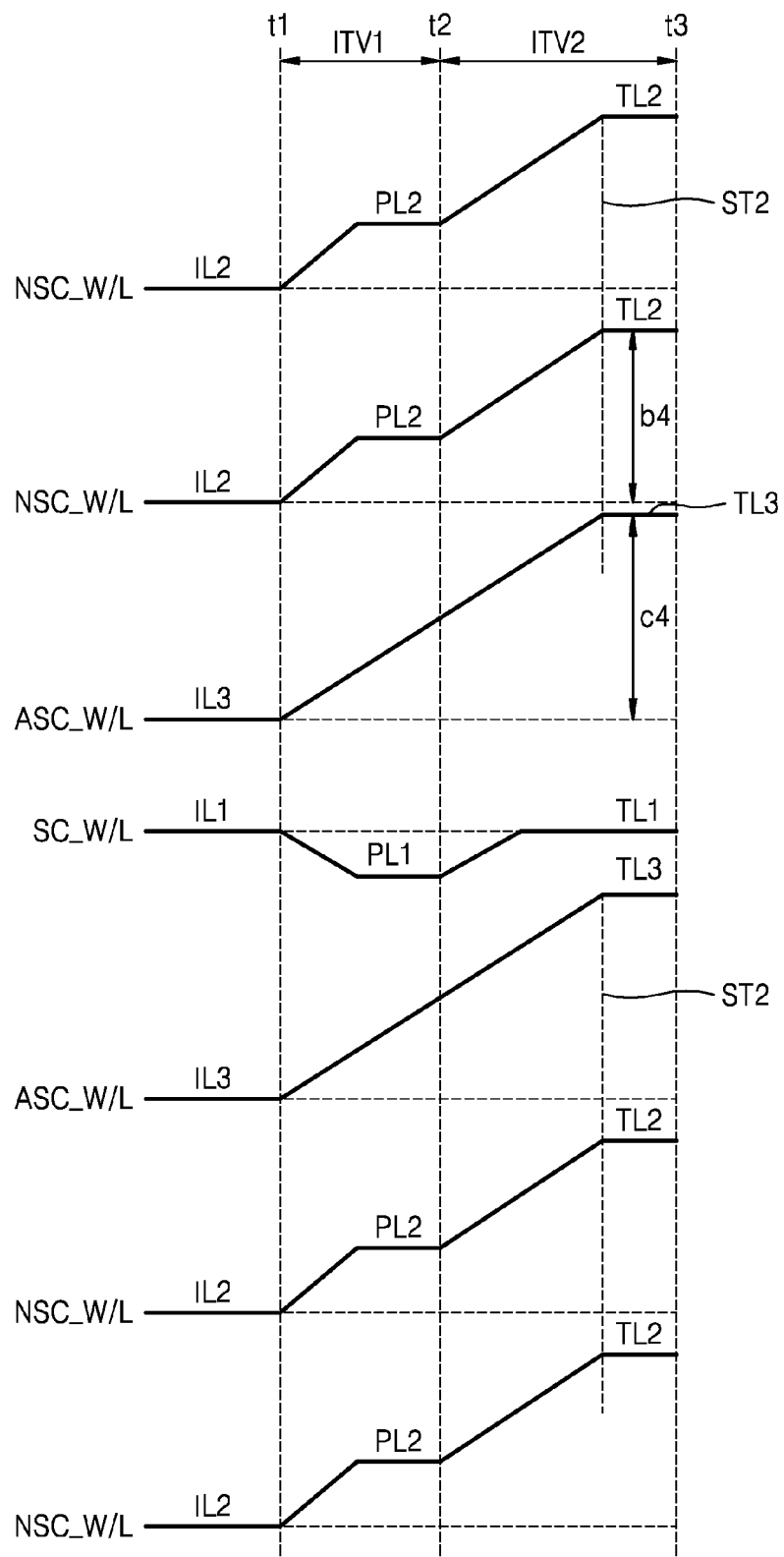
FIG. 9 is a timing diagram for describing a method of controlling a voltage level of each word line, according to another example embodiment.

FIG. 9 is a timing diagram for describing a method of controlling a voltage level of each word line, according to another example embodiment.

Referring to FIG. 9, the voltage controller 125 of FIG. 2 may control a word line voltage that is applied to the memory cell array 110, according to the timing diagram shown in FIG. 9. The voltage controller 125 may control the size c4 of a third target level TL3 of a second read pass voltage to be less than the size b4 of a second target level TL2 of a first read pass voltage. As a result, a time ST2 when the first read pass voltage is completely changed from a second preparation level PL2 to the second target level TL2 may be substantially the same as a time ST2 when the second read pass voltage is completely changed from a start level to the third target level TL3. Furthermore, by controlling the second target level TL2 of the second read pass voltage, which is applied to a second non-selected word line adjacent to a selected word line, to be less than a first target level TL1 of the first read pass voltage, a fringe field having an influence on a threshold voltage of a selected cell connected to the selected word line may be suppressed. The fringe field may occur due to a voltage difference between a selected cell and a cell adjacent thereto, and may have an influence on a threshold voltage of the selected cell, thereby lowering the reliability of a memory device. Details have been described above with reference to FIG. 5 and thus are omitted.

Figure 10:
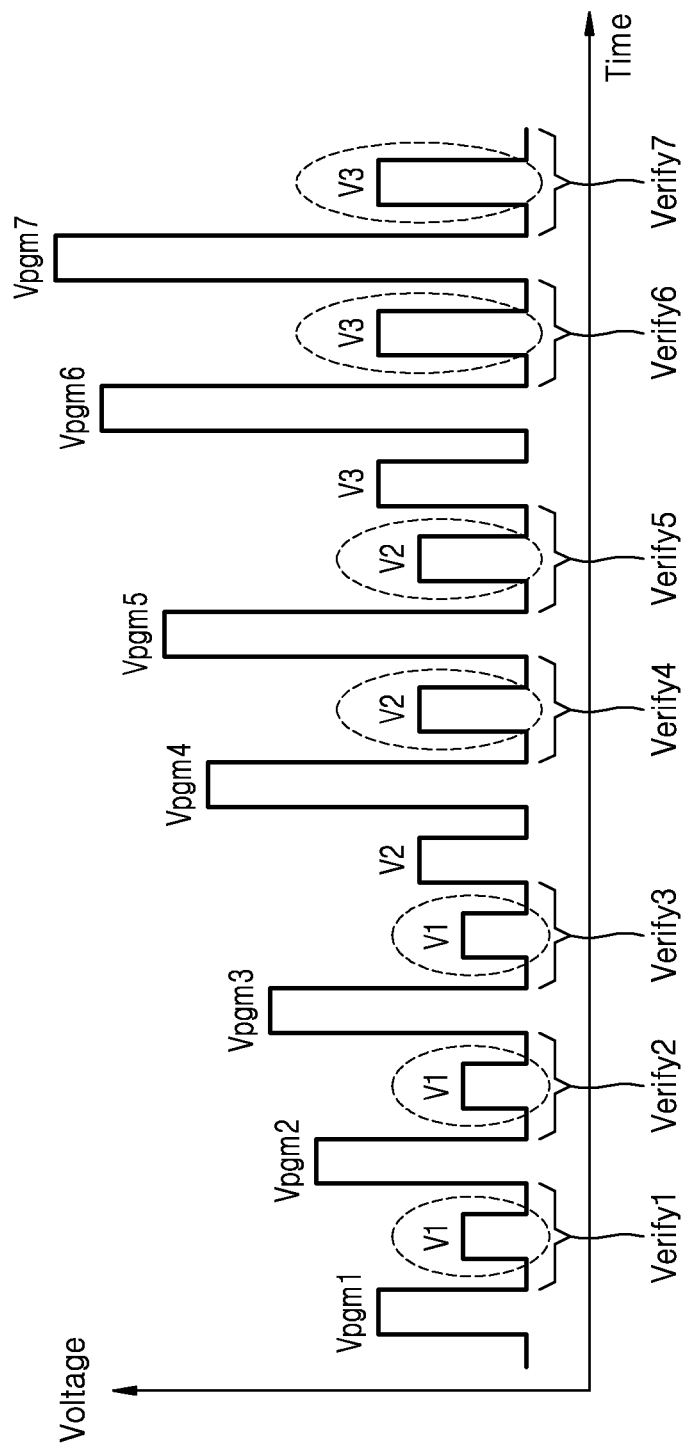
FIG. 10 is a diagram illustrating a program and verify operation when 2-bit data is written in memory cells.

FIG. 10 is a diagram illustrating a program and verify operation when 2-bit data is written in memory cells.

Referring to FIG. 10, as described above, the voltage controller 125 of FIG. 2 may control a verify voltage during a verify operation. The verify operation may be performed on a memory device by using an incremental step pulse programming (ISSP) method. In this case, when a verify operation is performed after each of program voltages Vpgm1 to Vpgm7 is applied to the memory device, the voltage controller 125 of FIG. 2 may control a verify voltage, which is applied to a selected word line, and a verify pass voltage, which is applied to non-selected word lines, in the same manner as a control method for the read voltage and the read pass voltage described above.

In an example embodiment, as shown in FIG. 5, the voltage controller 125 may control a first verify voltage V1, which is applied to a selected word line SC_W/L, to have the first preparation level PL1 and the first target level TL1 during first to third verify periods Verify1 to Verify3. The voltage controller 125 may control a first verify pass voltage, which is applied to a first non-selected word line NSC_W/L, to have the second preparation level PL2 and the second target level TL2. Also, the voltage controller 125 may control a second verify pass voltage, which is applied to a second non-selected word line ASC_W/L, to have the third target level TL3.

As shown in FIGS. 7 and 10, the voltage controller 125 may control a second verify voltage V2 to have the first preparation level PL1 and the first target level TL1 during fourth and fifth verify periods Verify4 and Verify5. In this case, the voltage controller 125 may control the first target level TL1 of the second verify voltage V2 to be greater than the first target level TL1 of the first verify voltage V1. Also, the voltage controller 125 may control the first preparation level PL1 of the second verify voltage V2 to be greater than the first preparation level PL1 of the first verify voltage V1. In addition, the voltage controller 125 may control the size a2 of the second preparation level PL2 of the first verify pass voltage, which is provided to the first non-selected word line NSC_W/L of FIG. 7 when the second verify voltage V2 is applied, to be greater than the size a1 of the second preparation level PL2 of the first verify pass voltage, which is provided to the first non-selected word line NSC_W/L of FIG. 5 when the first verify voltage V1 is applied.

Furthermore, the voltage controller 125 may control the first target level TL1 of the third verify voltage V3 to be greater than the first target level TL1 of the second verify voltage V2 during sixth and seventh verify period Verify6 and Verify7. Also, the voltage controller 125 may control the first preparation level PL1 of the third verify voltage V3 to be greater than the first preparation level PL1 of the second verify voltage V2. In addition, the voltage controller 125 may control the size of a second preparation level of a first verify pass voltage, which is provided to the first non-selected word line NSC_W/L when the third verify voltage V3 is applied, to be greater than the size a2 of the second preparation level PL2 of the first verify pass voltage, which is provided to the first non-selected word line NSC_W/L of FIG. 7 when the first verify voltage V1 is applied. Details have been described above and thus are omitted.

Figure 11:
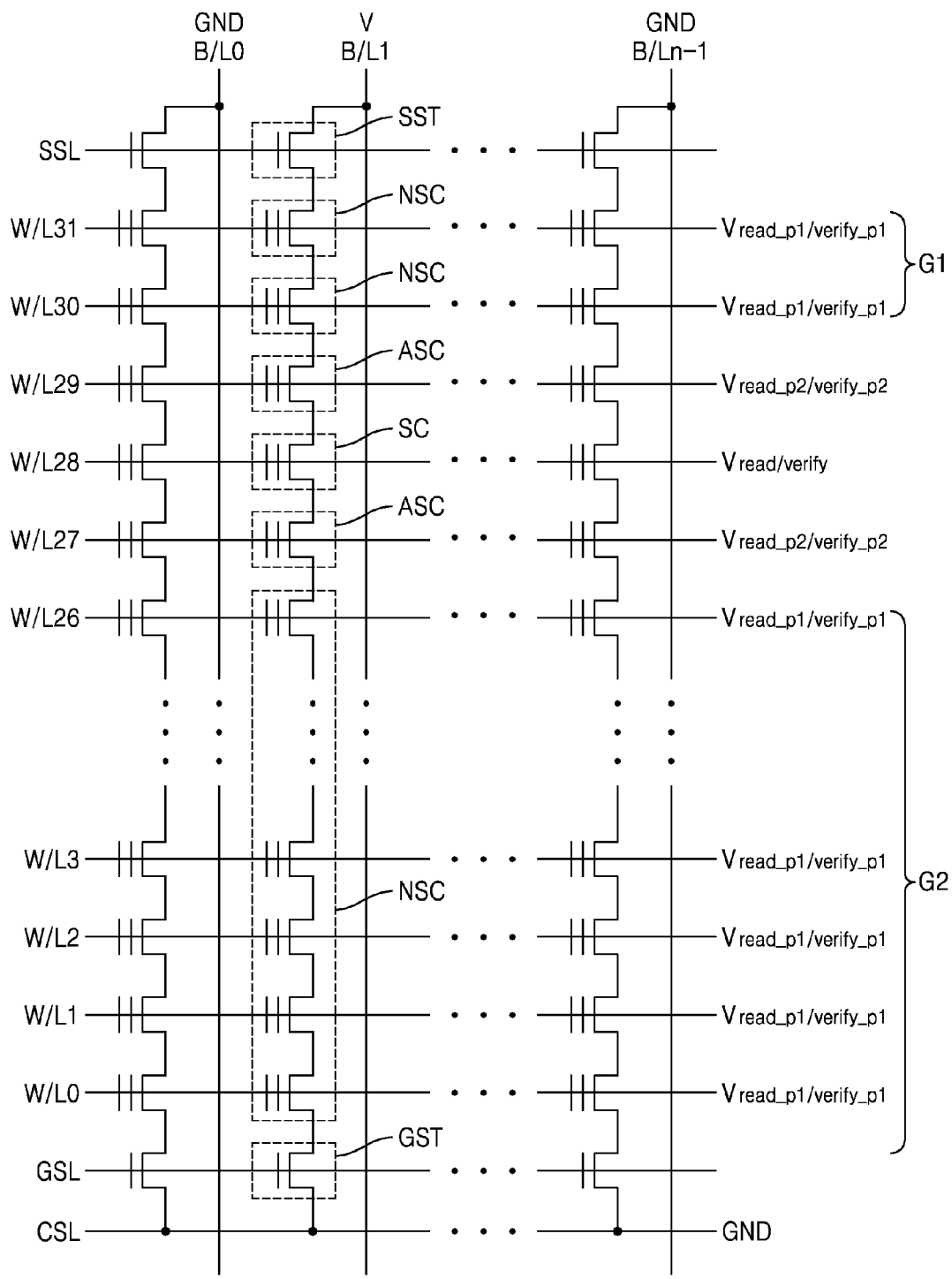
FIG. 11 is a diagram for describing a method of controlling a read pass voltage that is applied to word lines connected to first non-selected cells, based on the location of a selected cell, according to an example embodiment.

FIG. 11 is a diagram for describing a method of controlling a read pass voltage that is applied to word lines connected to first non-selected cells, based on the location of a selected cell, according to an example embodiment.

Referring to FIG. 11, the first block BLK1 in the memory cell array 110 of the memory device 100 illustrated in FIG. 2 may include string selection transistors SST connected to a plurality of bit lines B/L0 to B/Ln−1, respectively, ground selection transistors GST connected to a common source line CSL, and a plurality of memory cells connected in series between each string selection transistor SST and each ground selection transistor GST. Each of the plurality of memory cells is connected to a corresponding one of the plurality of word lines W/L0 to W/L31.

Hereinafter, a method of controlling a voltage, which is applied to a word line of a selected cell, and a voltage, which is applied to word lines of non-selected cells, in a read operation of the memory device 100 is described. For example, a selected cell SC may correspond to a cell where the bit line B/L and the word line W/L28 cross each other, as shown in FIG. 7. However, example embodiments of the inventive concepts are not limited thereto, and any other cell may be selected.

Word lines connected to first non-selected cells NSC above the selected cell SC may be set as a first group G1, and word lines connected to first non-selected cells NSC below selected cell SC may be set as a first group G2. The voltage controller 125 of FIG. 2 may control a voltage, which is applied to word lines of the first group G1, to be different from a voltage, which is applied to word lines of the second group G2.

In an example embodiment, the voltage controller 125 may control a first read pass voltage having a second preparation level and a second target level to be applied to word lines W/L30 and W/L31 of the first group G1, and may control a third read pass voltage having only the second target level to be applied to word lines W/L0 to W/L26 of the second group G2. However, this is only an example embodiment and the inventive concepts are not limited thereto. For example, the voltage controller 125 may control the first read pass voltage to be applied to the word lines W/L0 to W/L26 of the second group G2, and may control the third read pass voltage to be applied to the word lines W/L30 and W/L31 of the first group G1. Besides the example embodiment described above, various example embodiments may be applied to the method. In addition, during a verify operation of a memory device, the read voltage and read pass voltage control method described above may be applied with respect to a verify voltage and a verify pass voltage.

Figure 12:
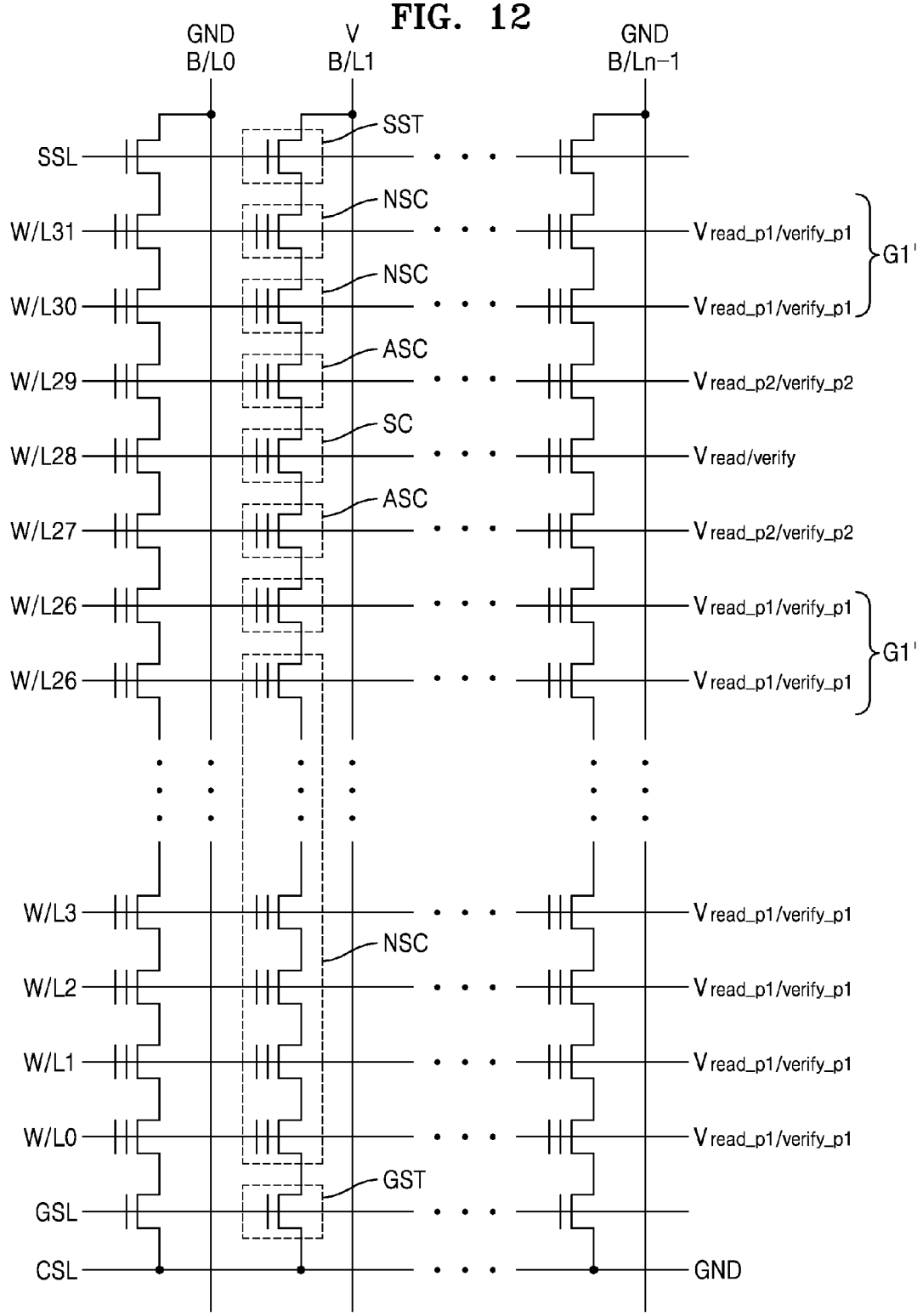
FIG. 12 is a diagram for describing a method of controlling a read pass voltage that is applied to word lines connected to first non-selected cells, based on the location of a selected cell, according to another example embodiment.

FIG. 12 is a diagram for describing a method of controlling a read pass voltage that is applied to word lines connected to first non-selected cells, based on the location of a selected cell, according to another example embodiment.

Referring to FIG. 12, word lines W/L30 and W/L31, located within a desired (or, alternatively, a predetermined) distance from a selected cell SC from among word lines connected to first non-selected cells NSC above the selected cell SC, and word lines W/L3 and W/L4, located within a desired (or, alternatively, a predetermined) distance from the selected cell SC from among word lines connected to first non-selected cells NSC below selected cell SC, may be set as a first group G1'. This is only an example embodiment, and example embodiments of the inventive concepts are not limited thereto. For example, the distance may be variously set, and the number of word lines included in the first group G1' may vary according to the set distance.

In an example embodiment, the voltage controller 125 may control a first read pass voltage having a second preparation level and a second target level to be applied to word lines W/L3, W/L4, W/L30, and W/L31 of the first group G1', and may control a third read pass voltage having only the second target level to be applied to word lines not included in the first group G1' from among word lines connected to the first non-selected cells NSC. However, this is only an example embodiment and the inventive concepts are not limited thereto. For example, the voltage controller 125 may control the third read pass voltage to be applied to the word lines W/L3, W/L4, W/L30, W/L31 of the first group G1', and may control the first read pass voltage to be applied to the word lines not included in the first group G1'. Besides the example embodiment described above, various example embodiments may be applied to the method. In addition, during a verify operation of a memory device, the read voltage and read pass voltage control method described above may be applied with respect to a verify voltage and a verify pass voltage.

Figure 13:
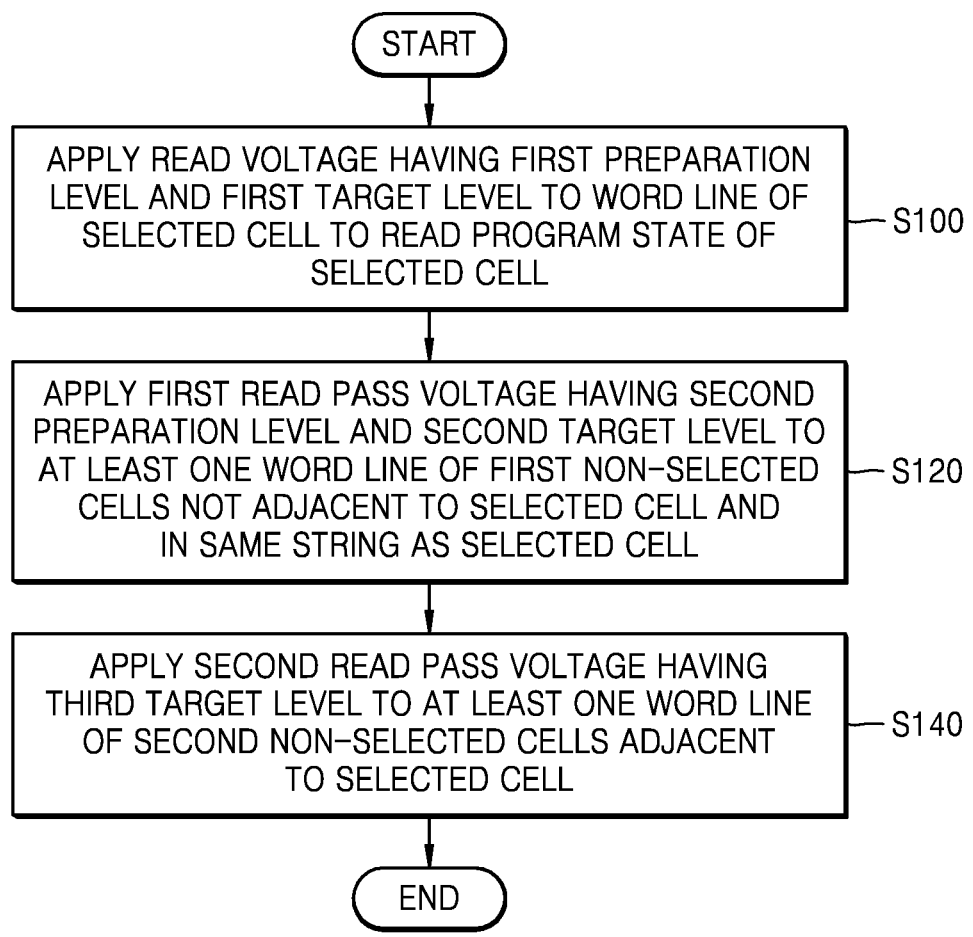
FIG. 13 is a flowchart of a method of controlling a read voltage and a read pass voltage, according to an example embodiment.

FIG. 13 is a flowchart of a method of controlling a read voltage and a read pass voltage, according to an example embodiment.

Referring to FIG. 13, when performing a read operation for a selected cell of a memory device, in operation S100, the voltage controller 125 may apply a read voltage having a first preparation level and a first target level to a word line of the selected cell to read a program state of the selected cell. In this case, the size of the first preparation level may be controlled according to the size of the first target level. For example, as the size of the first target level increase, the size of the first preparation level may increase. The size of the first preparation may be less than that of the first target level.

In operation S120, the voltage controller 125 may apply a first read pass voltage having a second preparation level and a second target level to at least one word line of first non-selected cells not adjacent to the selected cell and in the same string as the selected cell. In this case, the size of the second preparation level may be controlled according to the size of the first target level. For example, as the size of the first target level increase, the size of the second preparation level may increase. In other words, a difference between the size of the second target level and the size of the second preparation level may vary according to the size of the first target level.

In operation S140, the voltage controller 125 may apply a second read pass voltage having a third target level to at least one word line of second non-selected cells adjacent to the selected cell. In this case, the size of the third target level and the size of the second target level may be controlled to be equal to or different from each other.

Figure 14:
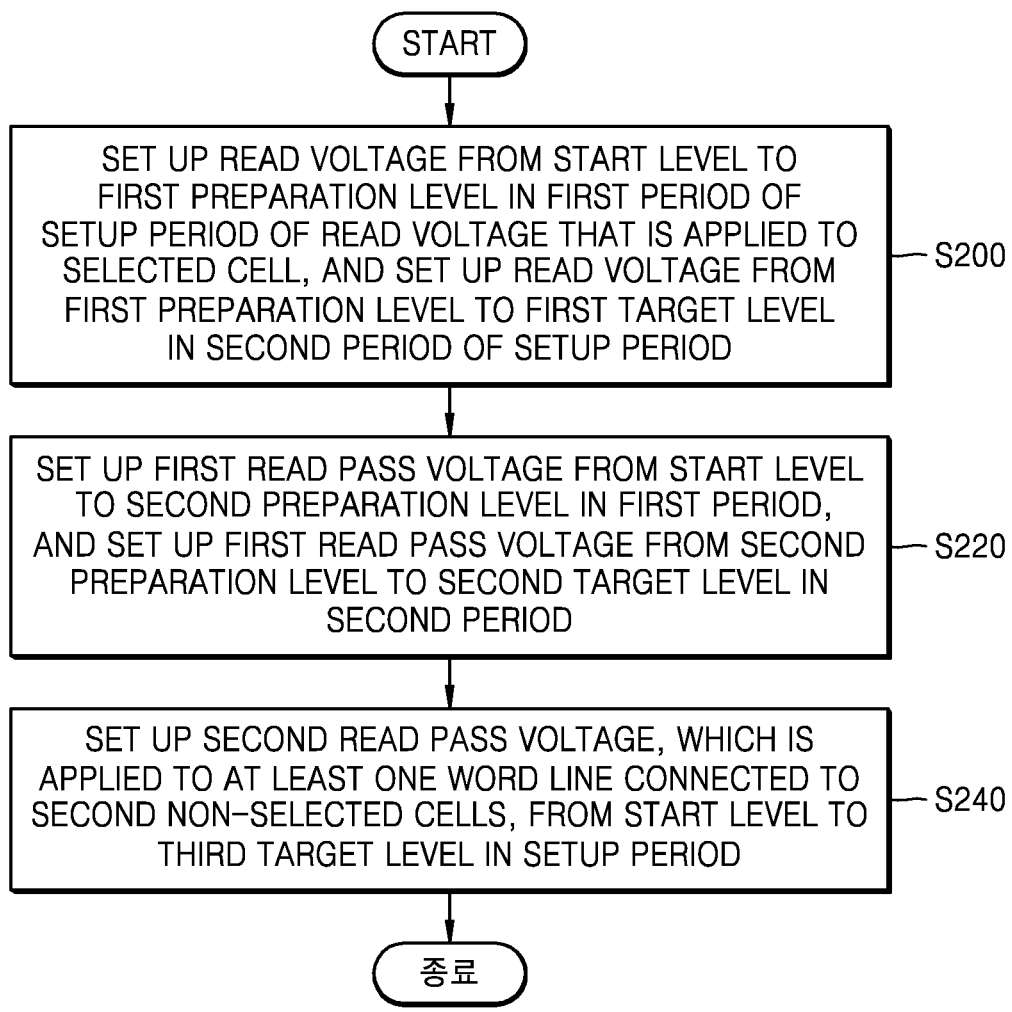
FIG. 14 is a flowchart of a method of controlling a read voltage and a read pass voltage, according to another example embodiment.

FIG. 14 is a flowchart of a method of controlling a read voltage and a read pass voltage, according to another example embodiment.

Referring to FIG. 14, in operation S200, the voltage controller 125 may adjust a read voltage from a start level to a first preparation level in a first period of a setup period of the read voltage that is applied to a selected cell, and adjust from the first preparation level to a first target level in a second period of the setup period of the read voltage.

In operation S220, the voltage controller 125 may adjust a first read pass voltage that is applied to at least one word line connected to first non-selected cells from a start level to a second preparation level in the first period, and adjust the first read pass voltage from the second preparation level to a second target level in the second period.

In operation S240, the voltage controller 125 may adjust a second read pass voltage that is applied to at least one word line connected to second non-selected cells from a start level to a third target level in the setup period. In this case, a time when the voltage controller 126 starts changing the read voltage from the first preparation level to the first target level may be substantially the same as a time when the first read pass voltage starts to be changed from the second preparation level to the second target level.

Figure 15:
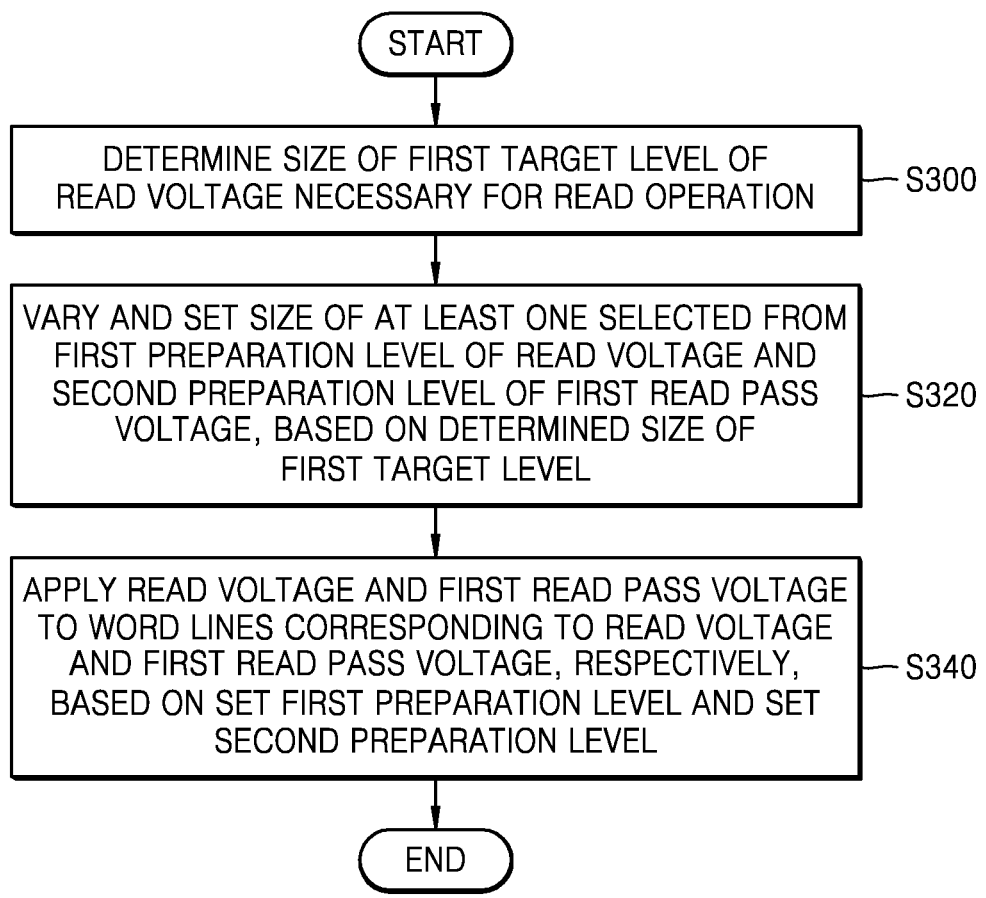
FIG. 15 is a flowchart of a method of controlling a read voltage and a read pass voltage, according to another example embodiment.

FIG. 15 is a flowchart of a method of controlling a read voltage and a read pass voltage, according to another example embodiment.

Referring to FIG. 15, in operation S300, the voltage controller 125 may determine the size of a first target level of a read voltage used for a read. In an embodiment, the voltage controller 125 of FIG. 2 may determine voltages Vr1 to Vr4 used to read data stored in a selected cell, as described with reference to FIG. 3B.

In operation S320, the voltage controller 125 may vary the size of at least one selected from a first preparation level of the read voltage and a second preparation level of a first read pass voltage based on the determined size of the first target level. In an embodiment, the voltage controller 125 may control the sizes of the first and second preparation levels to be varied and set based on the size of the first target level.

In operation S350, the voltage controller 125 may apply the read voltage and the first read pass voltage to word lines corresponding to the read voltage and the first read pass voltage, respectively, based on the set first preparation level and the set second preparation level.

Figure 16:
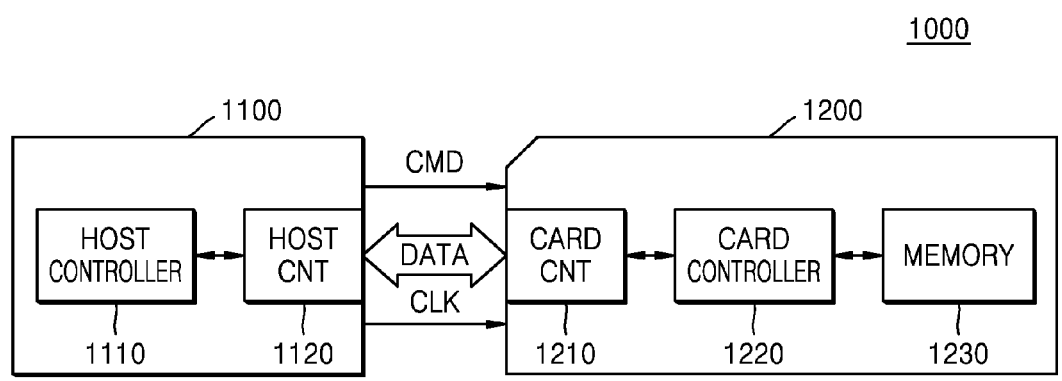
FIG. 16 is a block diagram of a memory card system according to an example embodiment.

FIG. 16 is a block diagram of a memory card system 1000 according to an example embodiment.

Referring to FIG. 16, the memory card system 1000 may include a host 1100 and a memory card 1200. The host 1100 may include a host controller 1110 and a host connector 1120. The memory card 1200 may include a card connector 1210, a card controller 1220, and a memory device 1230. In this case, the memory card 1200 may be realized by using the example embodiment of FIGS. 1 to 15.

Specifically, in a read operation or verify operation of the memory device 1230, a read/verify voltage, which is applied to a word line connected to a selected cell, a first read/verify pass voltage, which is applied to a word line connected to a first non-selected cell not adjacent to the selected cell, and a second read/verify voltage, which is applied to a word line connected to a second non-selected cell adjacent to the selected cell may be controlled to be different from each other. In an embodiment, the read/verify voltage may be controlled to have a first preparation level and a first target level, the first read/verify pass voltage may be controlled to have a second preparation level and a second target level, and the second read/verify pass voltage may be controlled to have a third target level.

The memory card 1200 may be configured to communicate with the host 1100 via at least one of various interface protocols such as USB, MMC, PCI-E, ATA, Serial-ATA, Parallel-ATA, SCSI, ESDI, and IDE.

The host 1100 may write data to the memory card 1200 or may read data stored in the memory card 1200. The host controller 1110 may transmit a clock signal CLK generated by a clock generator (not shown) in the host 1100 and data DATA to the memory card 1200 through the host connector 1120.

The card controller 1220 may synchronize data with a clock signal generated by a clock signal (not shown) in the card controller 1220 and may store the data in the memory device 1220, in response to a command received through the card connector 1210. The memory device 1220 may store the data transmitted from the host 1100.

The memory card 1200 may be any of a compact flash card (CFC), a microdrive, a smart media card (SMC), a multimedia card (MMC), a security digital card (SDC), a memory stick, and a USB flash memory driver.

Figure 17:
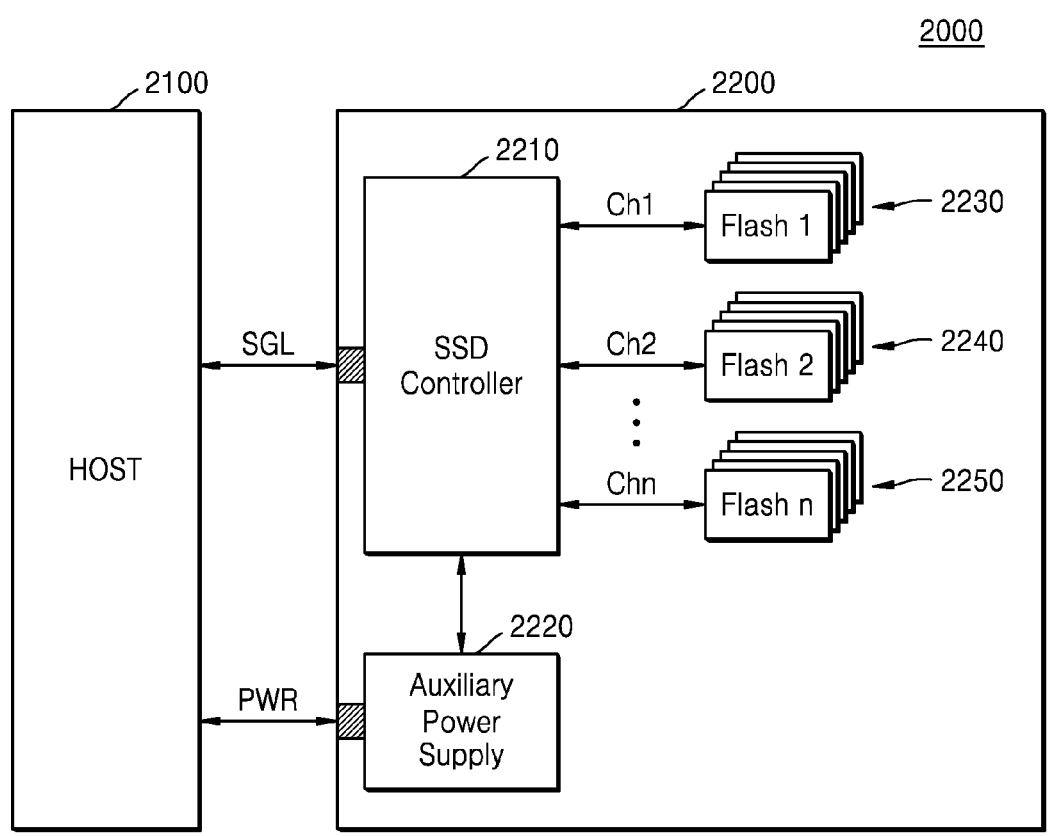
FIG. 17 is a block diagram of a solid-state disk (SSD) system according to an example embodiment.

FIG. 17 is a block diagram of a solid-state disk (SSD) system 2000 according to an example embodiment.

Referring to FIG. 17, the SSD system 2000 may include a host 2100 and an SSD 2200. The SSD 2200 transmits/receives a signal to/from the host 2100 through a signal connector, and receives power through a power connector. The SSD 2200 may include a SSD controller 2210, an auxiliary power supply 2220, and a plurality of memory devices 2230, 2240, and 2250. In this case, the SSD 2200 may be realized by using the example embodiments of FIGS. 1 to 24.

Specifically, in a read operation or verify operation of the plurality of memory devices 2230, 2240, and 2250, a read/verify voltage, which is applied to a word line connected to a selected cell, a first read/verify pass voltage, which is applied to a word line connected to a first non-selected cell not adjacent to the selected cell, and a second read/verify voltage, which is applied to a word line connected to a second non-selected cell adjacent to the selected cell may be controlled to be different from each other. In an embodiment, the read/verify voltage may be controlled to have a first preparation level and a first target level, the first read/verify pass voltage may be controlled to have a second preparation level and a second target level, and the second read/verify pass voltage may be controlled to have a third target level.

A memory card, a nonvolatile memory device, and a card controller according to example embodiments of the inventive concepts may be mounted by using any of various packages. For example, a flash memory device and/or a memory controller according to example embodiments of the inventive concepts may be mounted by using any of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi chip package (MCP), wafer-level fabricated package (WFP), and wafer-level processed stack package (WSP).

While example embodiments of the inventive concepts have been particularly shown and described with reference to some example embodiments thereof, it will be understood that various changes in form and details may be made therein without departing from the spirit and scope of the following claims. Accordingly, the technical scope of example embodiments of the inventive concepts should be defined by the accompanying claims.

What is claimed is:

1. A method of performing a data read operation on a memory device, the method comprising:
    applying a read voltage to a word line of a selected cell in the memory device to read a program state of the selected cell such that the read voltage is set to a first preparation level prior to reaching a first target level;
    applying a first read pass voltage to at least one word line of first non-selected cells, the first read pass voltage being set to a second preparation level prior to reaching a second target level such that the first read pass voltage level does not continuously increase until transition from an initial voltage level associated with the first read pass voltage to the second target level, the first non-selected cells being cells not adjacent to the selected cell and in a same string as the selected cell; and
    applying a second read pass voltage having a third target level to a word line of at least one second non-selected cell adjacent to the selected cell such that the second read pass voltage level continuously increases until transition from an initial voltage level associated with the second read pass voltage to the third target level.

2. The method of claim 1, wherein
    the applying a read voltage applies the read voltage such that the first target level is greater than the first preparation level, and
    the applying a first read pass voltage applies the first read pass voltage such that the second target level is greater than the second preparation level.

3. The method of claim 1, wherein the applying the first read pass voltage comprises:
    selectively applying a third read pass voltage having the second target level to the at least one of the word line of the first non-selected cells based on a location of the word line of the selected cell.

4. The method of claim 1, wherein the applying the first read pass voltage comprises:
    adjusting the first read pass voltage from a start level to the second preparation level in a first period; and
    adjusting the first read pass voltage from the second preparation level to the second target level in a second period.

5. The method of claim 4, wherein the applying the read voltage comprises:
    adjusting the read voltage from a start level to the first preparation level in the first period; and adjusting the read voltage from the first preparation level to the first target level in the second period.

6. The method of claim 5, wherein the applying the second read pass voltage comprises:
adjusting the second read pass voltage from a start level to the third target level during a third period, the third period being a time period equal to a sum of the first period and the second period.

7. The method of claim 1, wherein the applying the first read pass voltage and the applying the second read pass voltage apply voltages such that the second target level and the third target level are greater than a maximum threshold voltage level of a threshold voltage distribution of the selected cell.

8. The method of claim 1, wherein a size of the second target level is equal to or different from that of the third target level.

9. The method of claim 1, wherein the applying the read voltage sets the read voltage and the applying the first read pass voltage sets the first read pass voltage such that voltages associated with at least one of the first preparation level and the second preparation level varies according to the first target level of the read voltage used for the data read operation.

10. The method of claim 9, wherein the applying the read voltage sets the read voltage to the first preparation level and the applying the first read pass voltage sets the first read pass voltage to the second preparation level such that voltages associated with the first preparation level and the second preparation level increase as a size of the first target level increases.

11. The method of claim 1, wherein a size of the third target level is greater or less than that of the second target level.

12. A method of performing a program verify operation on a memory device, the method comprising:
applying a program voltage to a word line of a selected cell of the memory device, and a program pass voltage to word lines of non-selected cells of the memory device;
applying a verify voltage to the word line of the selected cell to verify a program state of the selected cell such that the verify voltage is set to a first preparation level prior to reaching a first target level;
applying a first verify pass voltage to at least one word line of first non-selected cells, the first verify pass voltage being set to a second preparation level prior to reaching a second target level such that the first read voltage level does not continuously increase until transition from an initial voltage level associated with the first read pass voltage to the second target level, the first non-selected cells being ones of the non-selected cells not adjacent to the selected cell and in a same string as the selected cell; and
applying a second verify pass voltage having a third target level to a word line of at least one second non-selected cell adjacent to the selected cell from among the non-selected cells such that the second read pass voltage level continuously increases until transition from an initial voltage level associated with the second pass voltage to the third target level.

13. The method of claim 12, wherein
the applying the verify voltage includes adjusting the verify voltage from a start level to the first preparation level, and adjusting the verify voltage from the first preparation level to the first target level, and
the applying the first verify pass voltage includes adjusting the first verify pass voltage from a start level to the second preparation level, and adjusting the first verify pass voltage from the second preparation level to the second target level.

14. The method of claim 13, wherein the applying the verify voltage and the applying the first verify pass voltage are such that a time when the verify voltage starts to change from the first preparation level to the first target level is substantially same as a time when the first verify pass voltage starts to change from the second preparation level to the second target level.

15. The method of claim 12, wherein the applying the first verify pass voltage sets the first verify pass voltage such that a difference between the second preparation level and the second target level varies based on a program state of the selected cell corresponding to a verify target.

16. A method of controlling a memory device, the method comprising:
receiving a request to read a program state associated a selected cell of the memory device;
first applying a read voltage to a word line of the selected cell such that the read voltage sequentially has a first preparation level and a target level; and
second applying one of at least two read pass voltages to different ones of non-selected cells of the memory devices based on whether the non-selected cells are adjacent to the selected cell, the at least two read pass voltages including a first read pass voltage and a second read pass voltage, and the second applying including,
applying the first read pass voltage to ones of the non-selected cells that are not adjacent to the selected cell, the first read pass voltage sequentially having a second preparation level and a second target level such that the first read voltage level does not continuously increase until transition from an initial voltage level associated the first read pass voltage to the second target level, and
applying the second read pass voltage to ones of the non-selected cells that are adjacent to the selected cell such that the second read pass voltage has a third target level such that the second read voltage level continuously increases until transition from an initial voltage level associated the second read pass voltage to the third target level.

17. The method of claim 16, wherein the third target level is a same voltage level as the second target level.

18. The method of claim 16, wherein the applying the first read pass voltage and the applying the second read pass voltage generate the first read pass voltage and the second read pass voltage, respectively, such that the first read pass voltage and the second read pass voltage are greater than a highest threshold voltage of programmed cells of the memory device.

19. The method of claim 16, wherein the applying the read voltage applies the read voltage to the selected cell such that the read voltage reaches the target level within a setup time, the setup time being less than a time for the read voltage to reach the target level, if each of the non-selected cells directly have a respective one of the second target level and the third target level.

* * * * *